US012641720B2

(12) United States Patent
Han et al.

(10) Patent No.: US 12,641,720 B2
(45) Date of Patent: May 26, 2026

(54) CIRCUIT BOARD

(71) Applicant: LG INNOTEK CO., LTD., Seoul (KR)

(72) Inventors: Jung Eun Han, Seoul (KR); Se Woong Na, Seoul (KR); Byeong Tae Im, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 405 days.

(21) Appl. No.: 18/033,459

(22) PCT Filed: Oct. 20, 2021

(86) PCT No.: PCT/KR2021/014689
§ 371 (c)(1),
(2) Date: Apr. 24, 2023

(87) PCT Pub. No.: WO2022/086163
PCT Pub. Date: Apr. 28, 2022

(65) Prior Publication Data
US 2023/0403790 A1 Dec. 14, 2023

(30) Foreign Application Priority Data
Oct. 23, 2020 (KR) ......................... 10-2020-0138142

(51) Int. Cl.
*H05K 1/02* (2006.01)
*H05K 1/11* (2006.01)
(Continued)

(52) U.S. Cl.
CPC ........... *H05K 1/0298* (2013.01); *H05K 1/115* (2013.01); *H05K 3/4092* (2013.01); *H05K 3/429* (2013.01); *H05K 2201/09727* (2013.01)

(58) Field of Classification Search
CPC .... H05K 1/0298; H05K 1/115; H05K 3/4092; H05K 3/429; H05K 1/111; H05K 3/3452
See application file for complete search history.

(56) References Cited

U.S. PATENT DOCUMENTS

| | | | |
|---|---|---|---|
| 9,040,838 B2 | 5/2015 | Lee et al. | |
| 10,062,623 B2 * | 8/2018 | Ryu | ....................... H05K 1/181 |

(Continued)

FOREIGN PATENT DOCUMENTS

| | | |
|---|---|---|
| JP | 2002-290022 A | 10/2002 |
| JP | 2002-374059 A | 12/2002 |

(Continued)

*Primary Examiner* — Timothy J Thompson
*Assistant Examiner* — Aditya Sharma
(74) *Attorney, Agent, or Firm* — Birch, Stewart, Kolasch & Birch, LLP

(57) ABSTRACT

A circuit board according to an embodiment includes an insulating layer including first to third regions; an outer circuit pattern disposed on upper surfaces of the first to third regions of the insulating layer, and a solder resist including a first part disposed on the first region of the insulating layer, a second part disposed on the second region, and a third part disposed on the third region, wherein the outer circuit pattern includes a first trace disposed on an upper surface of the first region of the insulating layer; a first pad disposed on an upper surface of the first region of the insulating layer; and a second trace disposed on an upper surface of the third region of the insulating layer; wherein an upper surface of the first part of the solder resist is positioned lower than an upper surface of the first trace; and a height of the first trace is different from a height of the first pad.

20 Claims, 15 Drawing Sheets

(51) Int. Cl.
    *H05K 3/40*        (2006.01)
    *H05K 3/42*        (2006.01)

(56)       References Cited

U.S. PATENT DOCUMENTS

| | | | |
|---|---|---|---|
| 10,134,679 B2 | 11/2018 | Kim et al. | |
| 11,622,446 B2 * | 4/2023 | Ohno | H05K 1/115 |
| | | | 174/262 |
| 2014/0037862 A1 * | 2/2014 | Lee | H01L 23/13 |
| | | | 205/125 |
| 2014/0054073 A1 * | 2/2014 | Lee | H05K 1/0296 |
| | | | 430/312 |
| 2016/0095216 A1 | 3/2016 | Nagai et al. | |
| 2016/0351506 A1 | 12/2016 | Kim et al. | |
| 2022/0346236 A1 * | 10/2022 | Yang | H05K 3/20 |
| 2023/0098947 A1 * | 3/2023 | Shibata | H05K 1/111 |
| | | | 174/250 |

FOREIGN PATENT DOCUMENTS

| | | | |
|---|---|---|---|
| JP | 2003-74364 A | 3/2003 | |
| JP | 2014-45195 A | 3/2014 | |
| JP | 2015-50307 A | 3/2015 | |
| JP | 2015-222771 A | 12/2015 | |
| JP | 2019-41031 A | 3/2019 | |
| KR | 10-2015-0092882 A | 8/2015 | |
| KR | 10-2016-0020407 A | 2/2016 | |
| KR | 10-2016-0068511 A | 6/2016 | |
| KR | 10-1811923 B1 | 12/2017 | |

* cited by examiner

【FIG. 1a】
<u>1</u>
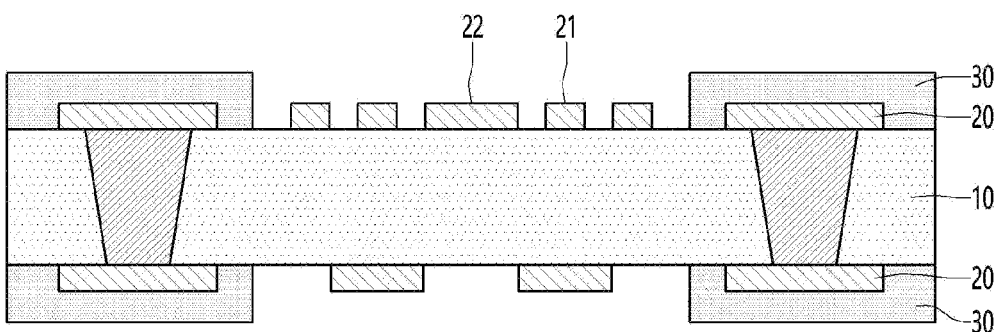
【FIG. 1b】
<u>1</u>
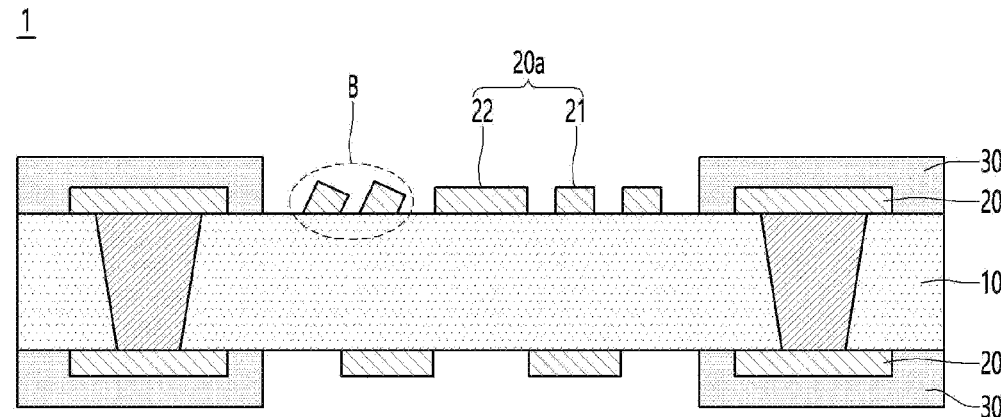

【FIG. 2】
1A
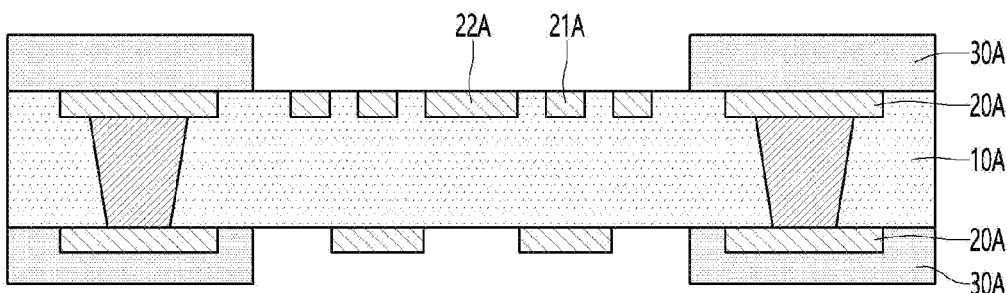

【FIG. 3】
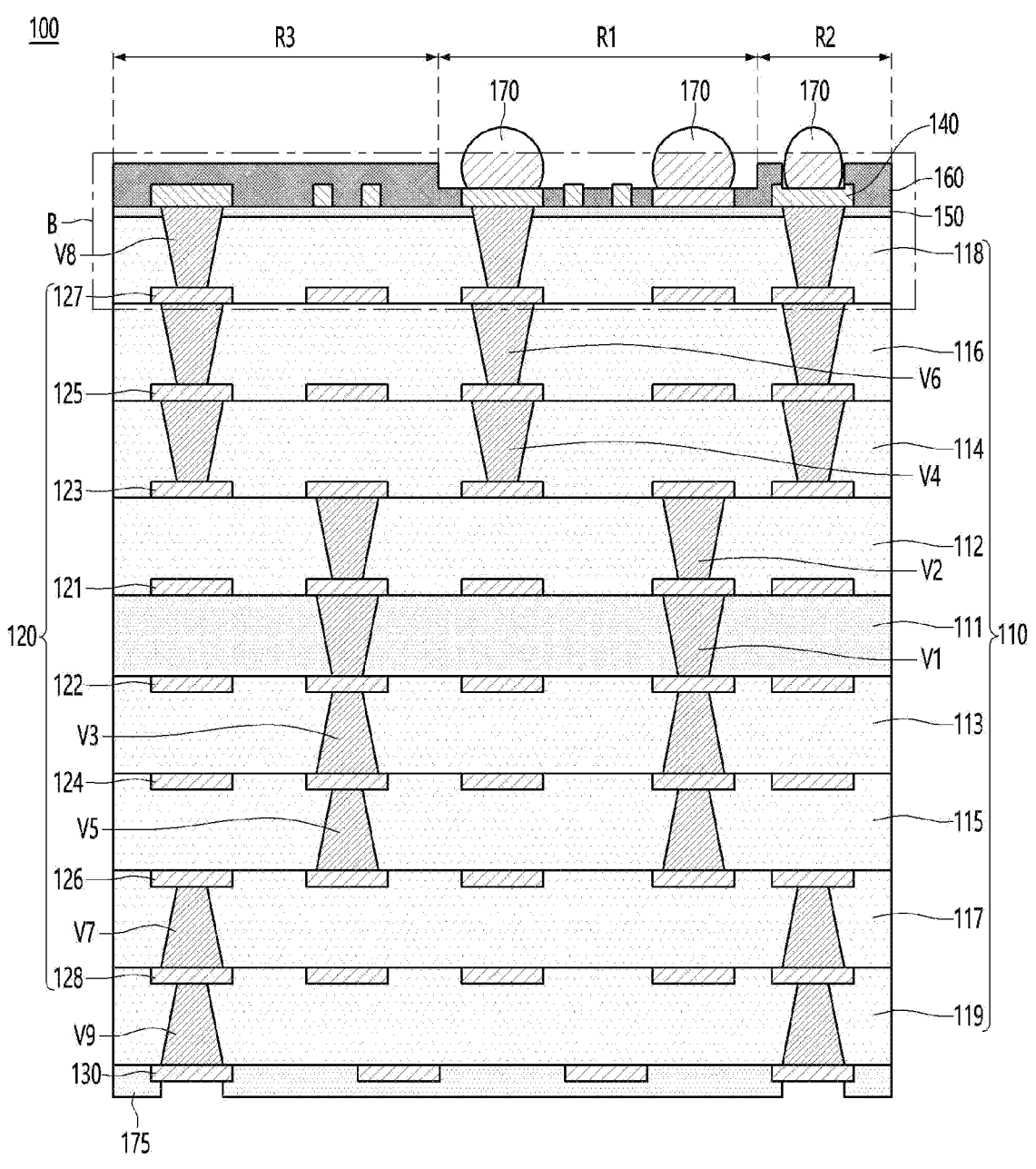

【FIG. 4】
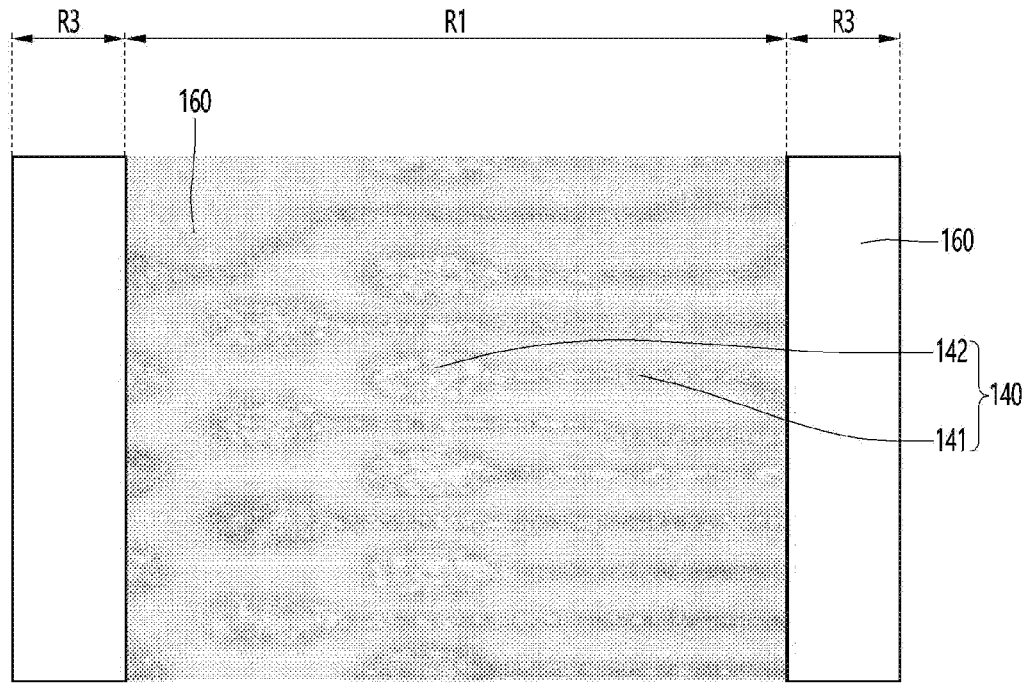
【FIG. 5】
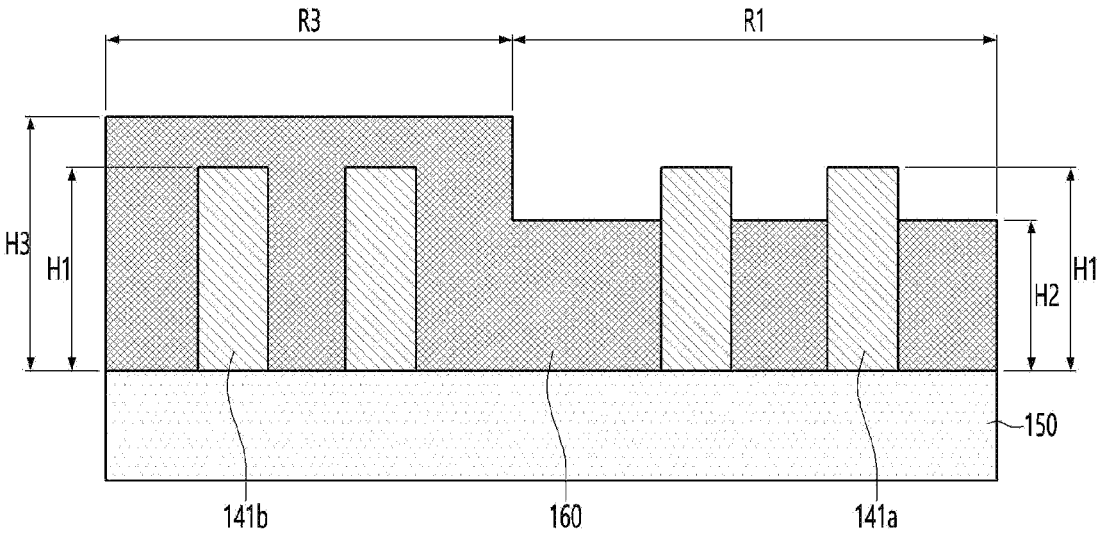

【FIG. 6】
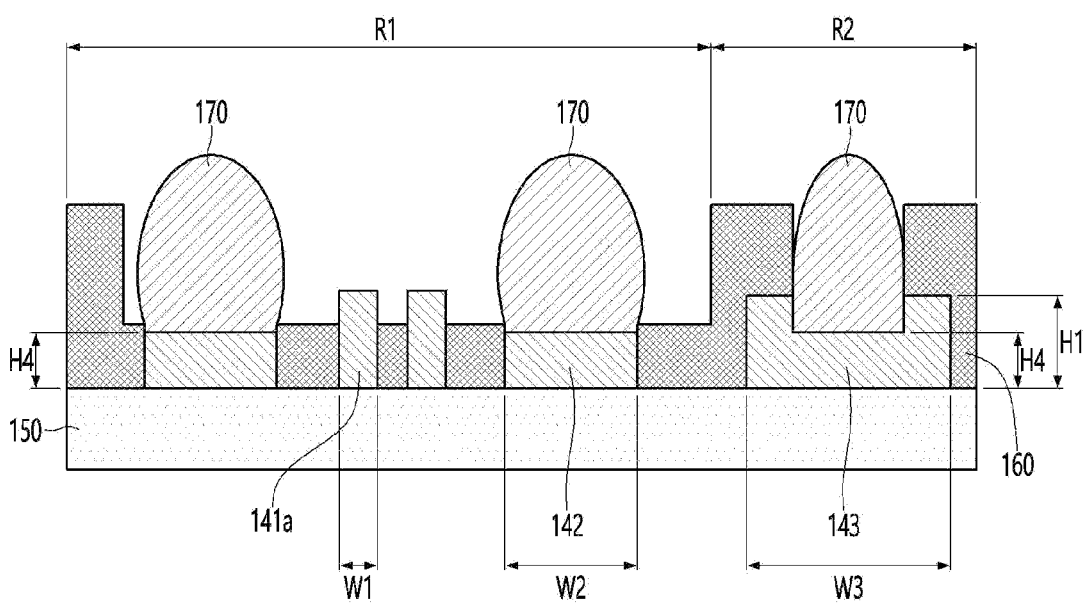

【FIG. 7】
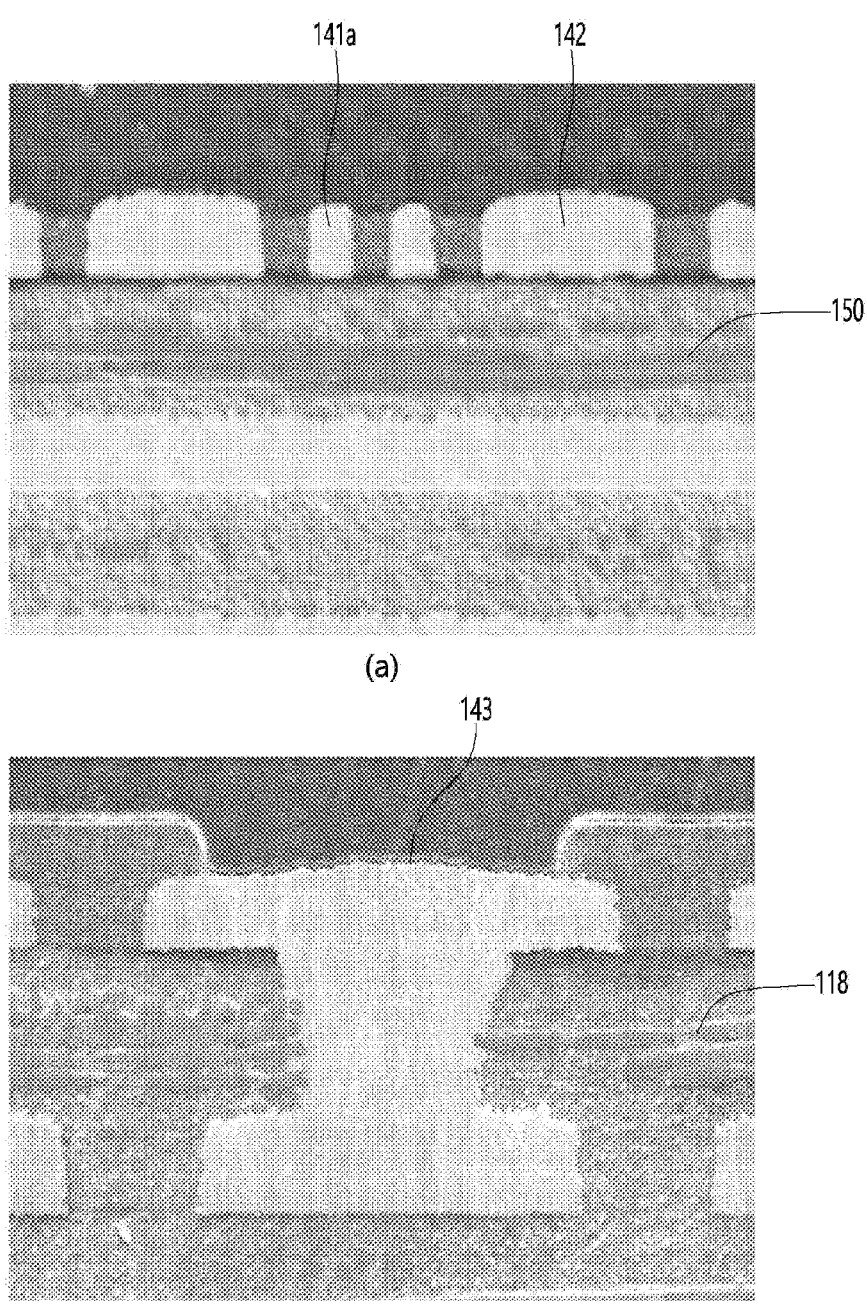
(a)
(b)

【FIG. 8】
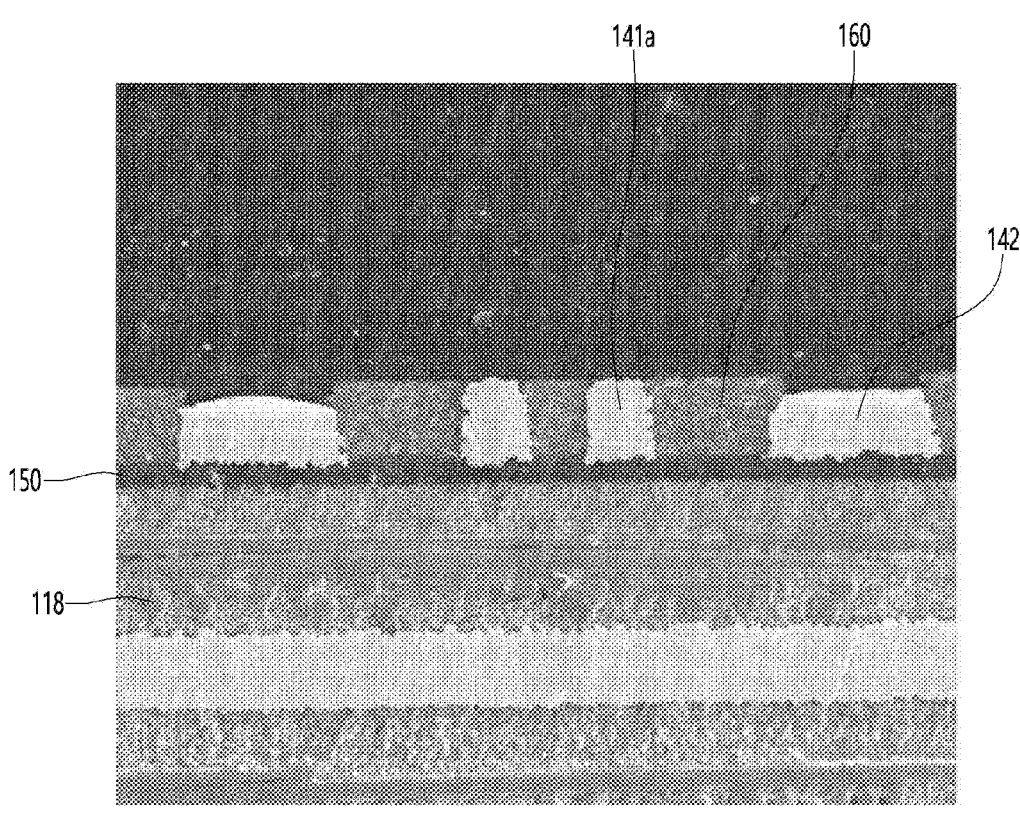

【FIG. 9】
100-1
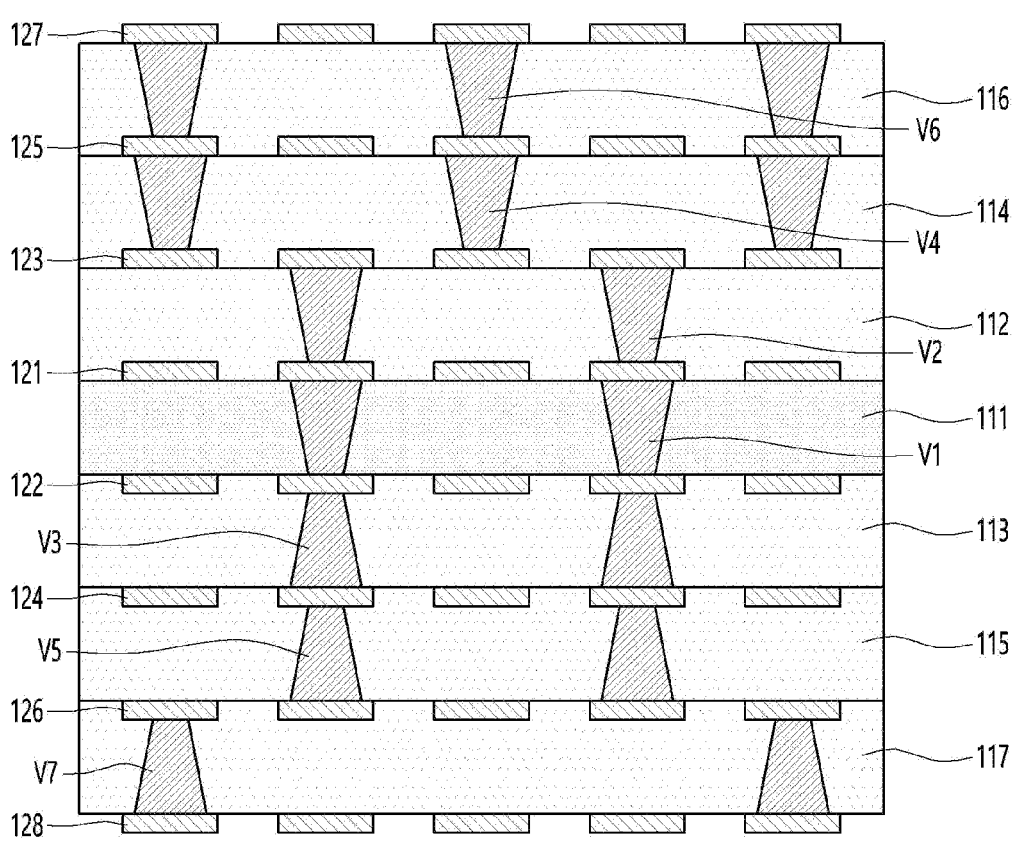

【FIG. 10】
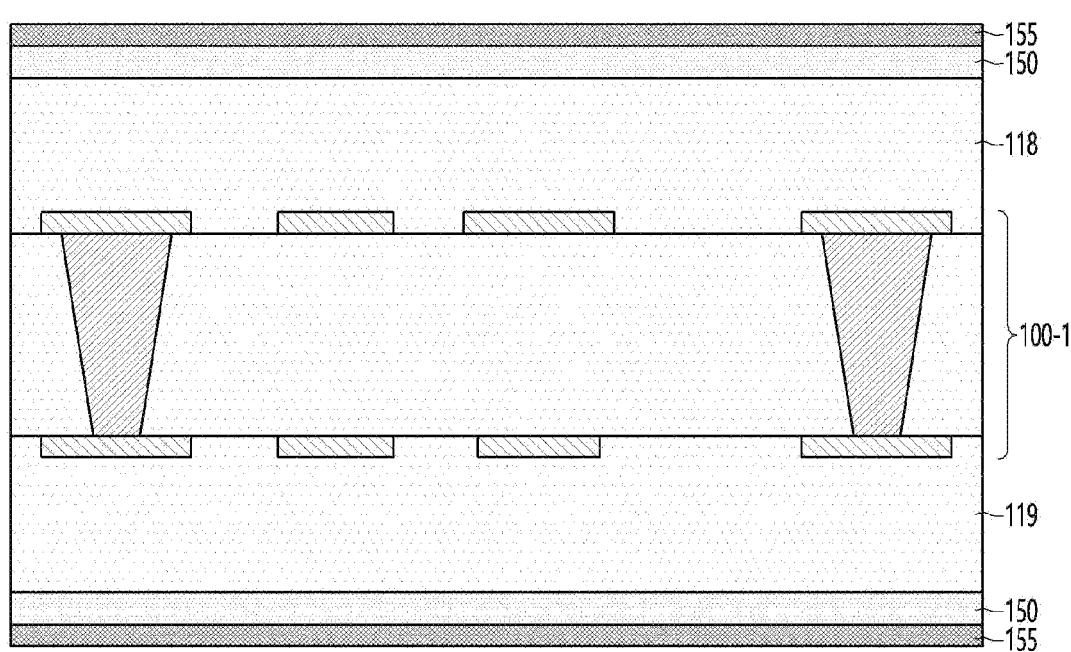

【FIG. 11】
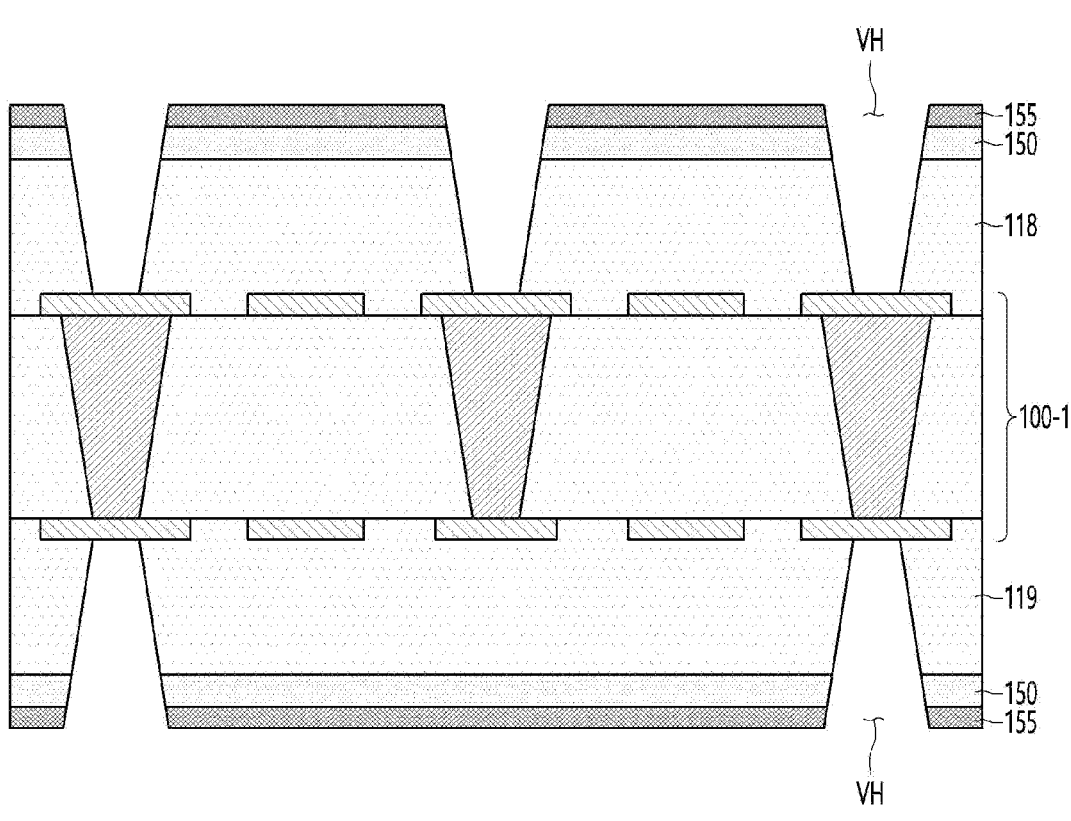

【FIG. 12】
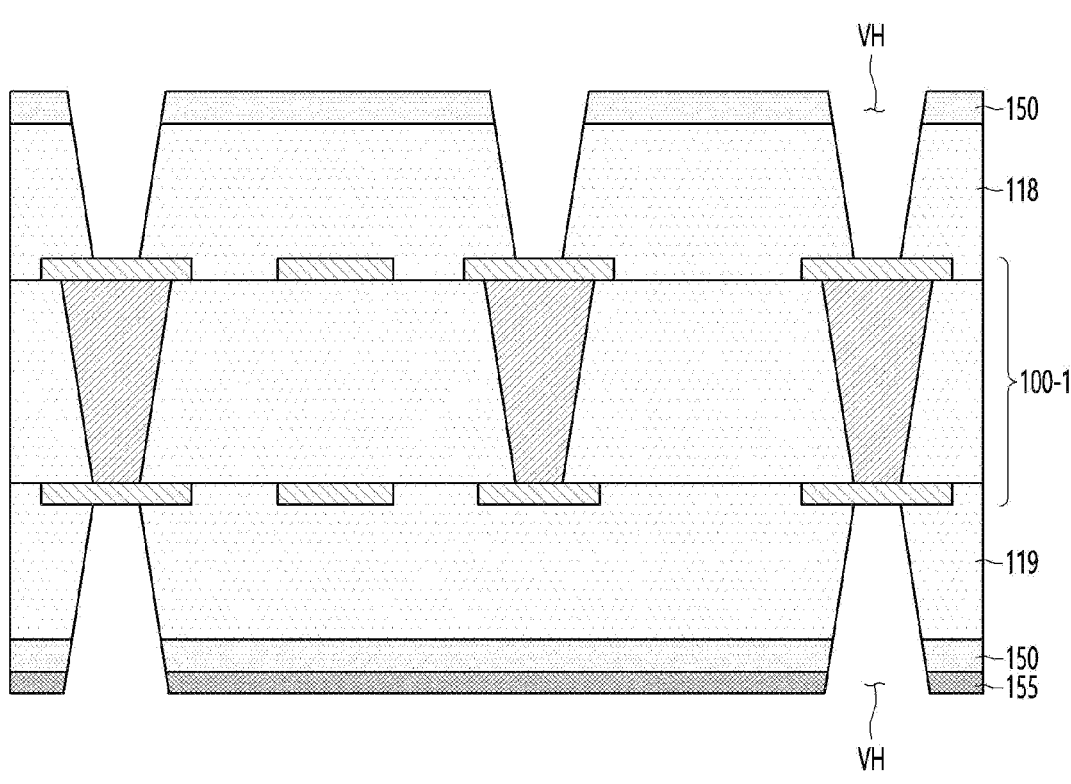

【FIG. 13】
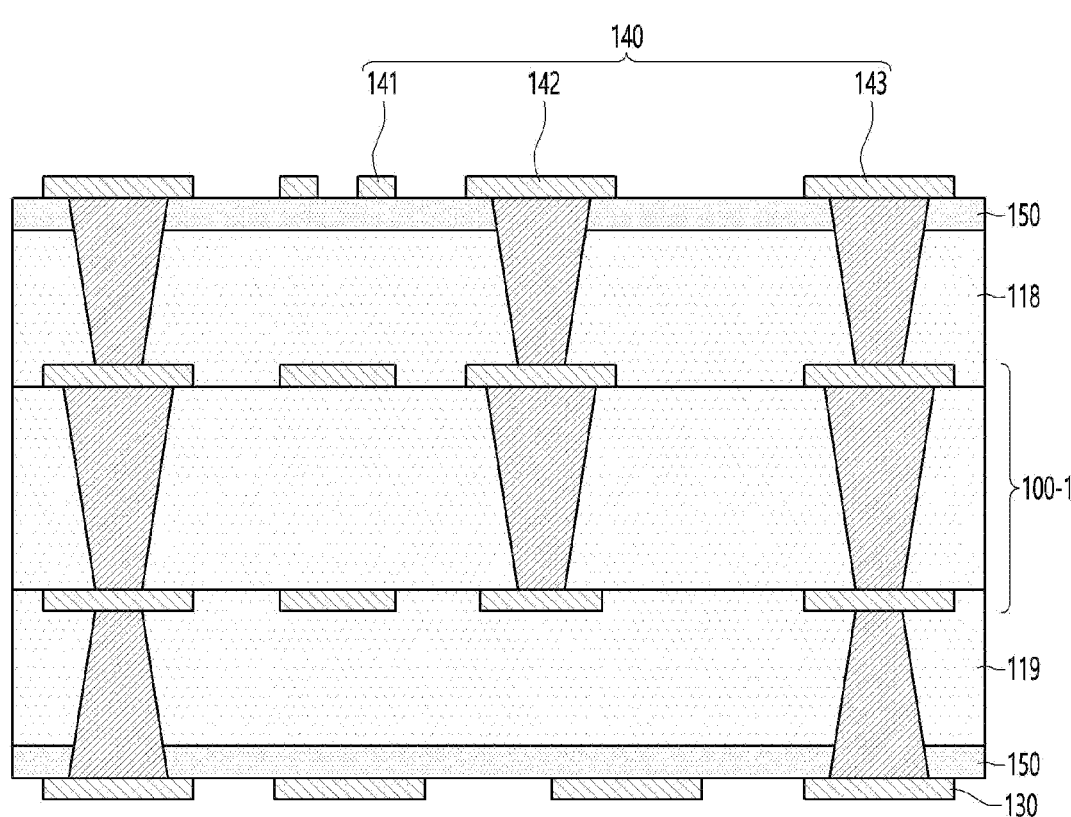

【FIG. 14】
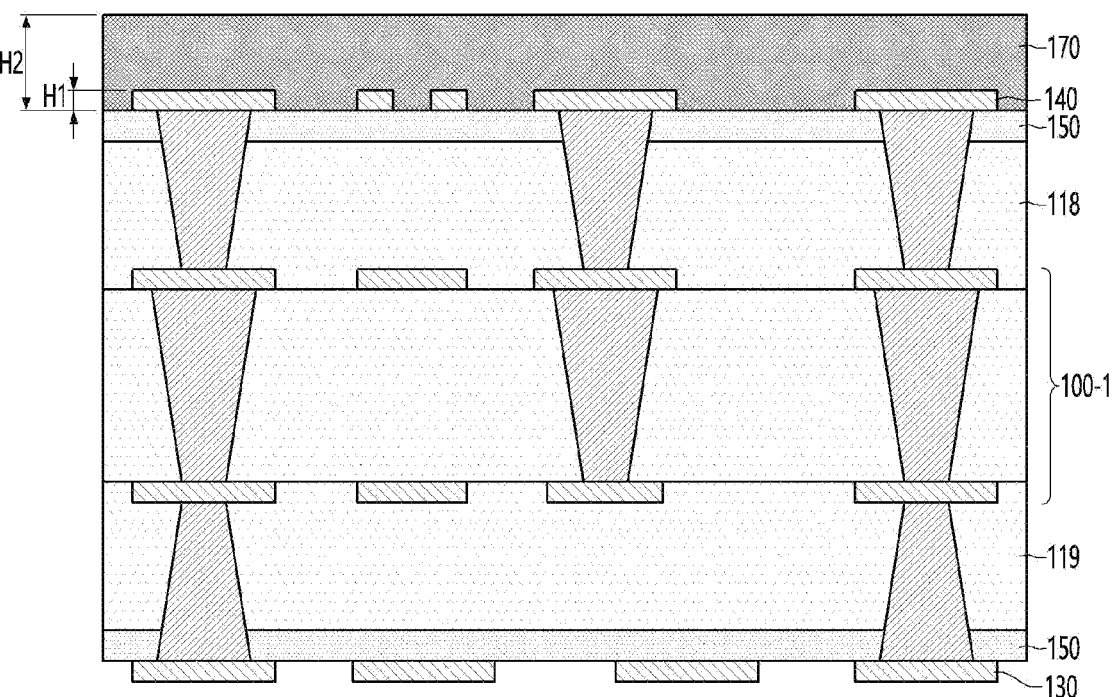

【FIG. 15】
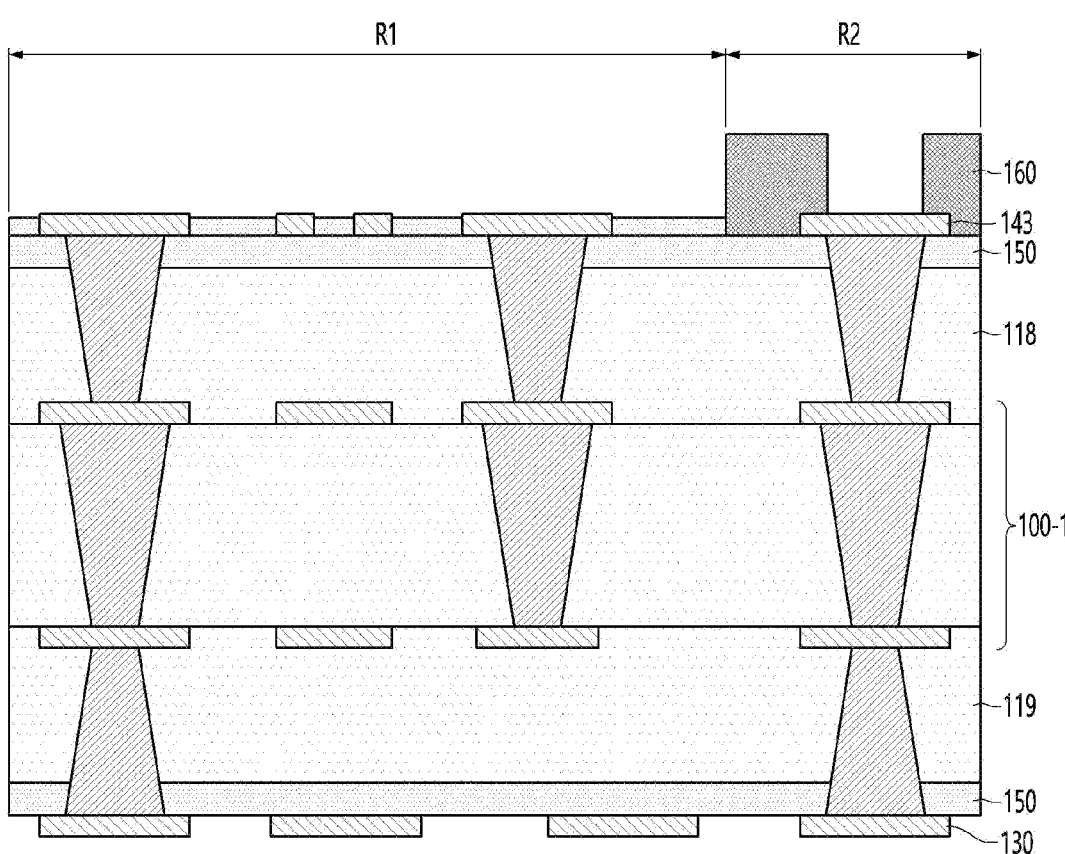

【FIG. 16】
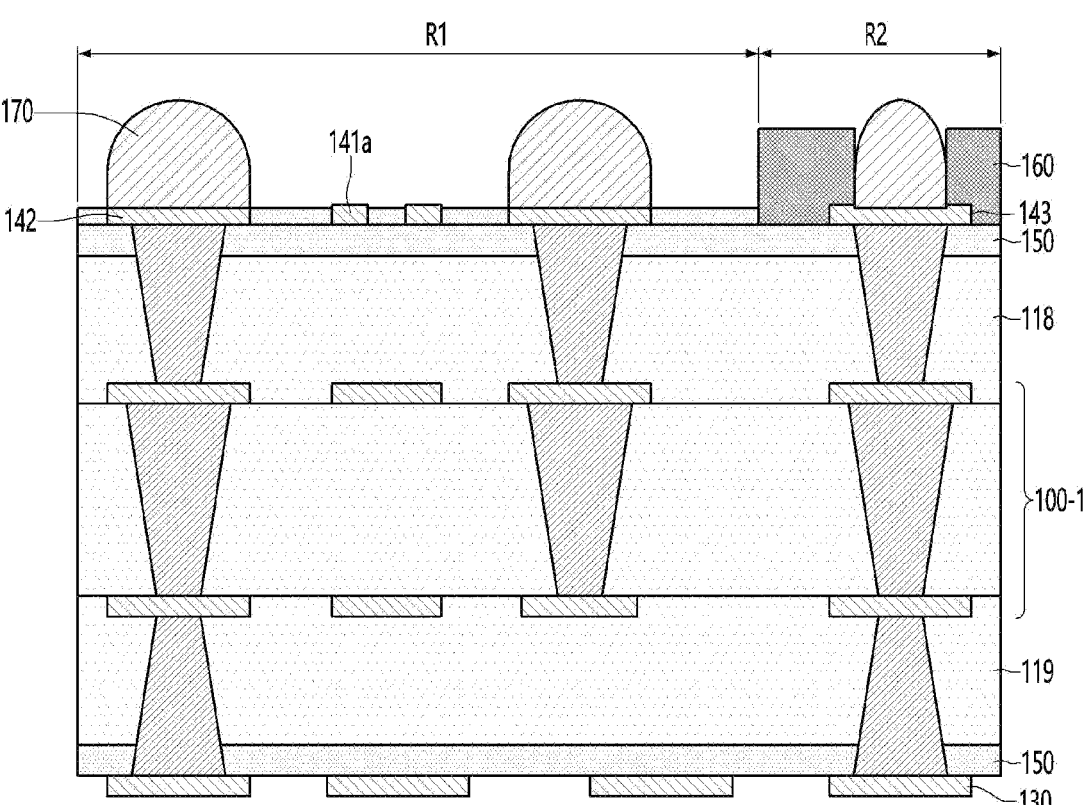

CIRCUIT BOARD

CROSS REFERENCE TO RELATED APPLICATIONS

This application is the National Phase of PCT/KR2021/014689 filed on Oct. 20, 2021, which claims priority under 35 U.S.C. § 119 (a) to Patent Application No. 10-2020-0138142 filed in the Republic of Korea on Oct. 23, 2020, all of which are hereby expressly incorporated by reference into the present application.

BACKGROUND

Technical Field

An embodiment relates to a circuit board, and more particularly, to a circuit board capable of supporting an outermost circuit pattern of the circuit board using a solder resist.

Discussion of the Related Art

A line width of a circuit has been made fine as miniaturization, weight reduction, and integration of an electronic component are accelerated. In particular, a line width of a circuit of a package substrate or a circuit board on which a semiconductor chip is mounted is miniaturized to several micrometers or less as design rules of semiconductor chips are integrated on a nanometer scale.

Various methods have been proposed in order to increase the degree of circuit integration of the printed circuit board, that is, to reduce the line width of the circuit. A semi-additive process (SAP) method and a modified semi-additive process (MSAP) have been proposed for the purpose of preventing loss of the line width of the circuit in a process of etching to form a pattern after copper plating.

Thereafter, an Embedded Trace Substrate (hereinafter referred to as 'ETS') method is a method of burying and embedding copper foil in an insulating layer in order to implement a finer circuit pattern, which is used in the related art. The ETS method is advantageous in that the circuit pitch is fine as there is no circuit loss due to etching, because a copper foil circuit is manufactured in a form embedded in the insulating layer instead of forming the copper foil circuit on the surface of the insulating layer.

Meanwhile, recently, efforts have been made to develop an improved 5G (5th generation) communication system or a pre-5G communication system in order to meet a demand for wireless data traffic. Here, the 5G communication system uses ultra-high frequency (mm-Wave) bands (sub 6 GHZ, 28 GHZ, 38 GHz, or higher frequencies) to achieve high data transfer rates.

Integrated technologies such as beamforming, Massive MIMO, and array antennas are being developed in the 5G communication system in order to mitigate the path loss of radio waves and increase the propagation distance of radio waves in the ultra-high frequency band. The antenna system is relatively large by having to consider that it can be equipped with hundreds of active antennas of wavelengths in the frequency bands.

The antenna and AP module are patterned or mounted on a circuit board, and accordingly, it is very important to reduce loss of the circuit board. This means that several substrates constituting the active antenna system, that is, an antenna substrate, an antenna power feeding substrate, a transceiver substrate, and a baseband substrate, should be integrated into one compact unit.

In addition, the circuit board applied to the 5G communication system as described above is manufactured in a trend of light, thin and compact, and accordingly, the circuit pattern is becoming gradually finer.

However, a conventional circuit board including a fine circuit pattern has a structure in which a circuit pattern disposed on an outermost side protrudes on an insulating layer, and thus there is problem that the circuit pattern disposed on the outermost side easily collapses.

SUMMARY

An embodiment provides a circuit board having a new structure and a method of manufacturing the same.

In addition, the embodiment provides a circuit board capable of providing a structure including a solder resist capable of supporting a circuit pattern disposed in a SR open region among circuit patterns disposed on the outermost side and a method of manufacturing the same.

In addition, the embodiment provides a circuit board capable of preventing a resin from remaining on a surface of the circuit pattern disposed in the SR open region and a method for manufacturing the same.

In addition, the embodiment provides a circuit board capable of allowing traces and pads disposed in the SR open region to have different heights and a method for manufacturing the same.

In addition, the embodiment provides a circuit board capable of making a height of an upper surface of the pad disposed in the SR open region lower than a height of an upper surface of the solder resist and a method for manufacturing the same.

Technical problems to be solved by the proposed embodiments are not limited to the above-mentioned technical problems, and other technical problems not mentioned may be clearly understood by those skilled in the art to which the embodiments proposed from the following descriptions belong.

A circuit board according to an embodiment comprises an insulating layer including first to third regions; an outer circuit pattern disposed on upper surfaces of the first to third regions of the insulating layer, and a solder resist including a first part disposed on the first region of the insulating layer, a second part disposed on the second region, and a third part disposed on the third region, wherein the outer circuit pattern includes a first trace disposed on an upper surface of the first region of the insulating layer; a first pad disposed on an upper surface of the first region of the insulating layer; and a second trace disposed on an upper surface of the third region of the insulating layer; wherein an upper surface of the first part of the solder resist is positioned lower than an upper surface of the first trace; and a height of the first trace is different from a height of the first pad.

In addition, the upper surface of the first part of the solder resist is positioned higher than an upper surface of the first pad.

In addition, a height of the first trace is same as a height of the second trace, and a height of the third part of the solder resist is higher than the height of each of the first trace and the second trace.

In addition, an upper surface of the first pad has a curved surface dissolved by a solder alloy.

In addition, a height of the first part of the solder resist satisfies a range of 70% to 85% of the height of the first trace.

In addition, the height of the first pad satisfies a range of 70% to 99% of a height of the first part of the solder resist.

In addition, the outer circuit pattern further includes a second pad disposed on an upper surface of the second region of the insulating layer; wherein the second pad includes a first portion covered with the second part of the solder resist; and a second portion exposed through an opening region of the second part of the solder resist; and a height of the first portion of the second pad is different from a height of the second portion of the second pad.

In addition, the height of the first portion of the second pad corresponds to the height of the first trace or the second trace; and the height of the second portion of the second pad corresponds to a height of the first pad.

In addition, the outer circuit pattern further includes a third pad disposed on an upper surface of the third region of the insulating layer; and wherein a height of the third pad is higher than the height of the first pad and is same as the height of the first trace or the second trace.

In addition, a surface roughness of each of the second part and the third part of the solder resist is smaller than a surface roughness of the first part of the solder resist.

In addition, the insulating layer includes a plurality of insulating layers, and the outer circuit pattern is disposed to protrude on an upper surface of an uppermost insulating layer among the plurality of insulating layers, and wherein the circuit board further comprises a primer layer disposed between the uppermost insulating layer and the outer circuit pattern and the solder resist.

In addition, the circuit board further comprises an adhesive part disposed on the upper surface of the first pad and including a solder alloy.

On the other hand, a method of manufacturing a circuit board according to an embodiment comprises preparing an inner substrate; forming an uppermost insulating layer having a primer layer disposed on the upper surface thereof on the inner substrate; forming an outer circuit pattern on the primer layer of the uppermost insulating layer; forming a solder resist layer covering the outer circuit pattern on the primer layer and divided into a first region, a second region, and a third region; partially exposing and developing the solder resist layer to form a solder resist including a first part formed on the first region, a second part formed on the second region, and a third part formed on the third region; dissolving a part of the outer circuit pattern exposed through the first part of the solder resist by a solder alloy; wherein the outer circuit pattern includes a first trace disposed on an upper surface of the first region of the insulating layer; a first pad disposed on an upper surface of the first region of the insulating layer; and a second trace disposed on an upper surface of the third region of the insulating layer; wherein the dissolving proceeds on the first pad, a height of the first pad before the dissolving is same as a height of the first trace, a height of the first pad after the dissolving is lower than a height of the first trace; and a height of the first part of the solder resist is lower than the height of the first trace and higher than a height of the first pad after the dissolving.

In addition, a height of the first trace is same as a height of the second trace, and a height of the third part of the solder resist is higher than the height of each of the first trace and the second trace.

In addition, an upper surface of the first pad has a curved surface dissolved by the solder alloy.

In addition, a height of the first part of the solder resist satisfies a range of 70% to 85% of a height of the first trace, and a height of the first pad after the dissolving satisfies a range of 70% to 99% of the height of the first part of the solder resist.

In addition, the outer circuit pattern includes a second pad disposed on an upper surface of the second region of the insulating layer, wherein the second pad includes a first portion covered with the second part of the solder resist; and a second portion exposed through an opening region of the second part of the solder resist; wherein the second portion of the second pad is dissolved together with the first pad; a height of the first portion of the second pad corresponds to the height of the first trace or the second trace; and a height of the second portion of the second pad after the dissolving corresponds to the height of the first pad after the dissolving.

In addition, a surface roughness of each of the second part and the third part of the solder resist is smaller than a surface roughness of the first part of the solder resist.

In addition, the solder alloy used to dissolve the first pad is removed or disposed on the first pad to function as an adhesive part for mounting a chip device.

Advantageous Effects

An embodiment may include a first pad and a first trace disposed in an open region of a solder resist, and may allow copper dissolution of the first pad to proceed using a lead-free solder alloy. In this case, a height of the first part of the solder resist is lower than heights the first pad and the first trace before dissolution. In addition, the embodiment allows a height of the first pad to be lower than the height of the first part of the solder resist through the copper dissolution of the first pad. Accordingly, the height of the first pad of the embodiment may be different from a height of the first trace. For example, the solder resist includes a first part. In addition, a height of the first part may be lower than a height of the first trace and higher than a height of the first pad. In this case, an upper surface of the first pad may have a curved surface dissolved by the lead-free solder alloy. Accordingly, the embodiment allows the height of the first pad before the dissolution to be higher than the height of the first part of the solder resist, so that a reliability problem in which resin remains on the upper surface of the first pad may be solved. In addition, the embodiment allows the height of the first pad after the dissolution to be lower than the height of the first part of the solder resist, so that an adhesive part can be stably supported.

BRIEF DESCRIPTION OF THE DRAWINGS

FIGS. 1a and 1b are views illustrating a circuit board according to a comparative example.

FIG. 2 is a view illustrating a circuit board manufactured by an ETS method in a comparative example.

FIG. 3 is a view illustrating a circuit board according to an embodiment.

FIG. 4 is a plan view of a circuit board including a protective layer according to an embodiment.

FIG. 5 is an enlarged view of a trace in a B region of FIG. 3.

FIG. 6 is a view illustrating R1 and R2 in a B region of FIG. 3.

FIG. 7 is a view illustrating a second outer circuit pattern before dissolution according to an embodiment.

FIG. 8 is a view illustrating a second outer circuit pattern after dissolution according to an embodiment.

FIGS. 9 to 16 are views illustrating a method of manufacturing a circuit board shown in FIG. 3 in order of process.

DETAILED DESCRIPTION OF THE EMBODIMENTS

Hereinafter, the embodiment disclosed in the present specification will be described in detail with reference to the accompanying drawings, but the same or similar components are designated by the same reference numerals regardless of drawing numbers, and repeated description thereof will be omitted. The component suffixes "module" and "part" used in the following description are given or mixed together only considering the ease of creating the specification, and have no meanings or roles that are distinguished from each other by themselves. In addition, in describing the embodiments disclosed in the present specification, when it is determined that detailed descriptions of a related well-known art unnecessarily obscure gist of the embodiments disclosed in the present specification, the detailed description thereof will be omitted. Further, the accompanying drawings are merely for facilitating understanding of the embodiments disclosed in the present specification, the technological scope disclosed in the present specification is not limited by the accompanying drawings, and it should be understood as including all modifications, equivalents and alternatives that fall within the spirit and scope of the present invention.

It will be understood that, although the terms "first," "second," etc. may be used herein to describe various elements, these elements should not be limited by these terms. These terms are only used to distinguish one element from another.

It will be understood that when an element is referred to as being "connected" or "coupled" to another element, it can be directly connected or coupled to the other element or intervening elements may be present. In contrast, when an element is referred to as being "directly connected" or "directly coupled" to another element, it will be understood that there are no intervening elements present.

As used herein, a singular expression includes a plural expression, unless the context clearly indicates otherwise.

It will be understood that the terms "comprise", "include", or "have" specify the presence of stated features, integers, steps, operations, elements, components and/or groups thereof disclosed in the present specification, but do not preclude the possibility of the presence or addition of one or more other features, integers, steps, operations, elements, components, and/or groups thereof.

Hereinafter, embodiments of the present invention will be described in detail with reference to the accompanying drawings.

Before explaining a present embodiment, a comparative example compared with the present embodiment will be described.

FIG. 1 is a view illustrating a circuit board according to a comparative example.

Referring to FIG. 1(*a*), the circuit board according to the comparative example includes a circuit pattern manufactured by a general SAP method.

Specifically, the circuit board includes an insulating layer 10, a circuit pattern 20, and a protective layer 30.

The circuit pattern 20 is respectively disposed on upper and lower surfaces of the insulating layer 10.

In this case, at least one of the circuit pattern 20 disposed on a surface of the insulating layer 10 includes a fine circuit pattern.

In FIG. 1, the circuit pattern 20 disposed on an upper surface of the insulating layer 10 includes a fine circuit pattern. The fine circuit pattern includes a trace 21 that is a signal transmission wiring line and a pad 22 for mounting a chip and the like.

In this case, an embodiment is to form a support layer using a solder resist for the purpose of protecting the fine circuit pattern, and therefore, a structure of a region where the fine circuit pattern is formed in the comparative example will be described.

In addition, the protective layer 30 for protecting the circuit pattern 20 is disposed on a surface of the insulating layer 10.

In this case, an upper region of the insulating layer 10 includes a first region in which the protective layer 30 is disposed and a second region which is an open region in which the protective layer 30 is not disposed.

Accordingly, a part of the circuit pattern 20 disposed on the upper surface of the insulating layer 10 is covered by the protective layer 30, and the remaining part is exposed to an outside without being covered by the protective layer 30.

In this case, the trace 21 and the pad 22 corresponding to the fine circuit pattern are disposed in the second region, which is the open region of the protective layer 30, as described above.

For example, at least one of the trace 21 and the pad 22 is formed in a width/distance of 15 μm/15 μm or less.

In this case, when a circuit pattern formed in the open region of the protective layer 30 is not a fine circuit pattern and has a width exceeding 15 μm, it may be resistant to external impact.

However, as shown in FIG. 1(*b*), the width and distance of the traces 21 and pads 22, which is fine circuit pattern provided on an outermost layer, decrease as the circuit pattern is gradually refined. Accordingly, when a fine circuit pattern protruding from the upper surface of the insulating layer 10 is disposed in the second region, which is an open region of the protective layer, the fine circuit pattern is easily collapsed by an external impact.

That is, the trace 21 corresponding to the fine circuit pattern of the outermost layer has an extremely fine pattern shape as in B shown in (b) of FIG, and as a result, there is a problem of easily collapsing or sweeping under a small external impact.

Meanwhile, recently, the fine circuit pattern disposed in the open region of the protective layer while having a structure buried in the insulating layer is formed by using a ETS method.

FIG. 2 is a view illustrating a circuit board manufactured by an ETS method in a comparative example.

Referring to FIG. 2, specifically, the circuit board includes an insulating layer 10A, a circuit pattern 20A, and a protective layer 30A.

The circuit pattern 20A is respectively disposed on upper and lower surfaces of the insulating layer 10A.

In this case, at least one of the circuit pattern 20A disposed on a surface of the insulating layer 10A includes a fine circuit pattern.

Here, when the circuit pattern is formed by the ETS method, a circuit pattern formed most preferentially has a structure buried in the insulating layer 10A. Accordingly, when the circuit pattern formed most preferentially is formed as a fine circuit pattern, the comparative example may have a structure in which a fine circuit pattern is buried in the insulating layer 10A.

That is, the circuit board manufactured by the ETS method includes a fine circuit pattern having a structure buried in the surface of the insulating layer 10A. That is, the fine circuit pattern includes a trace 21A, which is a signal transmission line, and a pad 22A for mounting a chip.

In addition, when the circuit board is manufactured by the ETS method as described above, the fine circuit pattern has a structure embedded in the insulating layer, so that the fine circuit pattern can be protected from external impact.

In this case, there is no great difficulty in manufacturing a circuit board having a two-layer structure (based on the number of layers of a circuit pattern) by the ETS method, as shown in FIG. 2. However, when manufacturing a circuit board having 8 layers or more, especially 10 layers or more, by the ETS method, a lead time for manufacturing a circuit board is at least 2 months, and accordingly, there is a problem in that productivity is lowered.

In addition, a fine circuit pattern must be formed first in a process of manufacturing a multi-layered circuit board in order to manufacture a fine circuit pattern of a buried structure by the ETS method. In addition, a circuit board of 8 to 10 layers are required to be applied to AP modules such as recent high-intensity/high-specification. In this case, the fine circuit pattern is first formed during the ETS process, damage is applied to the fine circuit pattern due to thermal stress or the like in a process of proceeding with the subsequent multi-layer lamination process, and accordingly, it is difficult to normally implement the fine circuit pattern.

In addition, when a circuit board is manufactured by the ETS method, an ETS core layer is separately required. In this case, when the circuit board is manufactured by the ETS method, an additional process is required to finally remove the ETS core layer.

In addition, when a circuit board is manufactured by the ETS method, the yield decreases due to accumulated tolerances when laminating more than a certain number of layers, the product cost is increased, and there is a problem that pattern damage due to stress increases as the lamination process proceeds on both sides based on the ETS core layer.

In addition, interest in a circuit board that can reflect the recent development of 5G technology is increasing. In this case, the circuit board must have a high multi-layer structure in order to apply 5G technology, and the circuit pattern must be refined accordingly. However, the comparative example is possible to form a fine pattern, but there is a problem that it cannot be stably protected.

Accordingly, the embodiment provides a circuit board with a new structure capable of solving the reliability problem of the fine pattern disposed at the outermost part and a method for manufacturing the same.

—Electronic Device—

Before describing the embodiment, an electronic device including a package substrate of the embodiment will be briefly described. The package substrate may have a structure in which at least one chip is disposed on a circuit board described below.

The electronic device includes a main board (not shown). The main board may be physically and/or electrically connected to various components. For example, the main board may be connected to the package substrate of the embodiment. Various chips may be mounted on the package substrate. Broadly, memory chips such as volatile memory (e.g. DRAM), non-volatile memory (e.g. ROM), flash memory, and the like, an application processor chip such as a central processor (e.g., CPU), a graphics processor (e.g., GPU), an antenna chip, a digital signal processor, an encryption processor, a microprocessor, and a microcontroller, and a logic chip such as an analog-to-digital converter or an application-specific IC (ASIC) may be mounted on the package substrate.

In addition, the embodiment miniatures a pitch of the pad, and provides a circuit board and a package substrate that can mount at least two chips of different types on one substrate according to the miniaturization of the pitch. Furthermore, the embodiment provides a circuit board and a package substrate capable of arranging more traces between mounting pads having a smaller pitch than the comparative example.

In this case, the electronic device may be a smart phone, a personal digital assistant, a digital video camera, a digital still camera, a network system, computer, a monitor, a tablet, a laptop, a netbook, a television, a video game, a smart watch, an automotive, or the like. However, the embodiment is not limited thereto, and in addition to these, any other electronic device for processing data may be included.

FIG. 3 is a view illustrating a circuit board according to an embodiment, FIG. 4 is a plan view of a circuit board including a protective layer according to an embodiment, FIG. 5 is an enlarged view of a trace in a B region of FIG. 3, and FIG. 6 is a view illustrating R1 and R2 in a B region of FIG. 3.

Before describing FIGS. 3 to 6, the circuit board according to the embodiment may have a multilayer structure. Preferably, the circuit board according to the embodiment may have a structure of ten or more layers based on a number of layers of the circuit pattern. However, this is only an embodiment and is not limited thereto. That is, the circuit board according to the embodiment may have a number of layers smaller than 10 layers, or differently, may have a number of layers larger than 10 layers.

However, the circuit board according to the embodiment is to solve the problems of the ETS method of the comparative example. In this case, the ETS method in the comparative example has many problems in manufacturing the circuit board with eight or more layers, and accordingly, the embodiment will be described as having a ten-layer structure for comparison.

Referring to FIGS. 3 to 6, a circuit board 100 includes an insulating layer 110.

Preferably, the circuit board 100 may include first to ninth insulating layers 111, 112, 113, 114, 115, 116, 117, 118, and 119 in order to implement a ten-layer structure.

In this case, the first insulating layer 111, the second insulating layer 112, the third insulating layer 113, the fourth insulating layer 114, the fifth insulating layer 115, the sixth insulating layer 116, and the seventh insulating layer 117 of the insulating layer 110 may be an inner insulating layer disposed inside in a laminated structure of the insulating layer, and the eighth insulating layer 118 may be an uppermost insulating layer (a first outermost insulating layer) disposed on the inner insulating layer, and the ninth insulating layer 119 may be a lowermost insulating layer (a second outermost insulating layer) disposed under the inner insulating layer.

The first insulating layer 111 may be a core insulating layer disposed at a center in the laminated structure of the insulating layer 110. The second insulating layer 112, the fourth insulating layer 114, the sixth insulating layer 116, and the eighth insulating layer 118 may be an upper insulating layer sequentially disposed on the first insulating layer 111. In addition, the third insulating layer 113, the fifth insulating layer 115, the seventh insulating layer 117, and the ninth insulating layer 119 may be a lower insulating layer sequentially disposed under the first insulating layer 111.

The insulating layer 110 may be a substrate on which an electric circuit capable of changing wiring is formed and may include all of a printed circuit board, a wiring board, and an insulating substrate made of an insulating material capable of forming circuit patterns on a surface thereof.

For example, at least one of the insulating layer 110 may be rigid or flexible. For example, at least one of the insulating layer 110 may include glass or plastic. Specifically, at least one of the insulating layer 110 may include a chemically tempered/semi-tempered glass, such as soda lime glass, aluminosilicate glass, etc., a tempered or flexible plastic such as polyimide (PI), polyethylene terephthalate (PET), propylene glycol (PPG), polycarbonate (PC), etc., or sapphire.

In addition, at least one of the insulating layer 110 may include an optically isotropic film. For example, at least one of the insulating layer 110 may include cyclic olefin copolymer (COC), cyclic olefin polymer (COP), optically isotropic PC, optically isotropic polymethylmethacrylate (PMMA), or the like.

In addition, at least one of the insulating layer 110 may be partially bent while having a curved surface. That is, at least one of the insulating layer 110 may partially have a plane and may partially be bent while having a curved surface. Specifically, an end portion of at least one of the insulating layer 110 may be bent while having a curved surface, or bent or crooked while having a surface with a random curvature.

In addition, at least one of the insulating layer 110 may be a flexible substrate having flexibility. Further, at least one of the insulating layer 110 may be a curved or bent substrate. In this case, at least one of the insulating layer 110 may form a wiring layout for electrical wirings which connect circuit components based on a circuit design, and electrical conductors may be disposed on an insulating material. In addition, electrical components may be mounted on at least one of the insulating layer 110, and at least one of the insulating layer 110 may form wirings configured to connect the electrical components to make a circuit, and may mechanically fix the components besides functioning to electrically connect the components.

A circuit pattern may be disposed on a surface of the insulating layer 110.

That is, the circuit pattern may be disposed on a surface of each of the first to ninth insulating layers 111, 112, 113, 114, 115, 116, 117, 118, and 119 constituting the insulating layer 110.

Here, the circuit pattern may include an inner circuit pattern 120 and an outer circuit pattern 130 and 140. The inner circuit pattern 120 may be a circuit pattern disposed inside the insulating layer 110 in a laminated structure of the circuit board, and the outer circuit pattern 130 and 140 may be a circuit pattern disposed on an outermost side of the insulating layer 110 in the laminated structure of the circuit board.

The inner circuit pattern 120 may include a first circuit pattern 121, a second circuit pattern 122, a third circuit pattern 123, a fourth circuit pattern 124, a fifth circuit pattern 125, and a sixth circuit pattern 126, and a seventh circuit pattern 127.

The first circuit pattern 121 may be disposed on an upper surface of the first insulating layer 111, and thus the first circuit pattern 121 may be covered by the second insulating layer 112. The second circuit pattern 122 may be disposed on a lower surface of the first insulating layer 111, and thus the second circuit pattern 122 may be covered by the third insulating layer 113. The third circuit pattern 123 may be disposed on an upper surface of the second insulating layer 112, and thus the third circuit pattern 123 may be covered by the fourth insulating layer 114. The fourth circuit pattern 124 may be disposed on a lower surface of the third insulating layer 113, and thus the fourth circuit pattern 124 may be covered by the fifth insulating layer 115. The fifth circuit pattern 125 may be disposed on an upper surface of the fourth insulating layer 114, and thus the fifth circuit pattern 125 may be covered by the sixth insulating layer 116. The sixth circuit pattern 126 may be disposed on a lower surface of the fifth insulating layer 115, and thus the sixth circuit pattern 126 may be covered by the seventh insulating layer 117. The seventh circuit pattern 127 may be disposed on an upper surface of the sixth insulating layer 116, and thus the seventh circuit pattern 127 may be covered by the eighth insulating layer 118. The eighth circuit pattern 128 may be disposed on a lower surface of the seventh insulating layer 117, and thus the eighth circuit pattern 128 may be covered by the ninth insulating layer 119.

The outer circuit pattern may be disposed on a surface of an outermost insulating layer disposed on an outermost side of the insulating layer 110. Preferably, the outer circuit pattern may include a first outer circuit pattern 130 disposed under a lower surface of the ninth insulating layer 119 disposed at a lowermost side of the insulating layer 110.

In addition, the outer circuit pattern may include a second outer circuit pattern 140 disposed on an upper surface of the eighth insulating layer 118 disposed on an uppermost side of the insulating layer 110.

In this case, at least one of the first outer circuit pattern 130 and the second outer circuit pattern 140 may be formed to protrude on the surface of the insulating layer. Preferably, the first outer circuit pattern 130 may be formed to protrude below the lower surface of the ninth insulating layer 119. In addition, the second outer circuit pattern 140 may be formed to protrude on the upper surface of the eighth insulating layer 118.

That is, an upper surface of the first outer circuit pattern 130 may be positioned on the same plane as the lower surface of the ninth insulating layer 119. In addition, a lower surface of the second outer circuit pattern 140 may be positioned on the same plane as an upper surface of a primer layer 150 disposed on an upper surface of the eighth insulating layer 180.

In other words, a primer layer 150 may be disposed on the upper surface of the eighth insulating layer 180 and the second outer circuit pattern 140.

That is, the second outer circuit pattern 140 may include a fine circuit pattern. Preferably, the second outer circuit pattern 140 may be a fine circuit pattern having a line width of 10 μm or less and a distance between patterns of 10 μm or less. Accordingly, when the second outer circuit pattern 140 is directly disposed on the eighth insulating layer 118, the second outer circuit pattern 150 may be separated from the eighth insulating layer 118 as a contact area between the eighth insulating layer 118 and the second outer circuit pattern 140 is small.

Therefore, in the embodiment, the primer layer 150 is disposed between the second outer circuit pattern 140 and the eighth insulating layer 118. The primer layer 150 may improve bonding force between the second outer circuit pattern 140 and the eighth insulating layer 118. The primer layer 150 may be disposed to entirely cover the upper surface of the eighth insulating layer 118. In addition, the second outer circuit pattern 140 may be partially disposed on the primer layer 150. Therefore, the upper surface of the primer layer 150 in an embodiment may include a first portion in contact with the second outer circuit pattern 140 and a second portion in contact with a lower surface of a solder resist 160 to be described later. That is, when the second outer circuit pattern 140 is formed by the SAP process, the primer layer 150 may serve to reinforce bonding strength between the eighth insulating layer 118 and the second outer circuit pattern 140. The primer layer 150 may include a polyurethane-based resin, an acrylic resin, or a silicone-based resin, but is not limited thereto.

Meanwhile, it is illustrated in FIG. 3 that the primer layer is not disposed between the ninth insulating layer 119 and the first outer circuit pattern 130, but the primer layer may also be formed between the ninth insulating layer 119 and the first outer circuit pattern 130. However, the first outer circuit pattern 130 may not be the fine circuit pattern, and accordingly, the primer layer between the ninth insulating layer 119 and the first outer circuit pattern 130 may be selectively omitted.

Consequently, when the fine circuit pattern is disposed in the inner layer of the circuit board, the primer layer may be omitted as the fine circuit pattern is covered by at least one of the insulating layers 110. On the other hand, when a fine circuit pattern is disposed on the outermost side, there is no insulating layer covering the microcircuit pattern, and accordingly, the embodiment allows the primer layer 150 to be disposed to improve bonding strength between the fine circuit pattern and the insulating layer.

Hereinafter, it will be described that the second outer circuit pattern 140 is formed of a fine circuit pattern. However, the embodiment is not limited thereto, and the first outer circuit pattern 130 may also be formed of the fine circuit pattern, and accordingly, it will be apparent that the structure for improving reliability, such as strengthening bonding force and preventing collapse of the second outer circuit pattern 140 described below, can be applied to the first outer circuit pattern 130 as well.

The inner circuit pattern 120, the first outer circuit pattern 130, and the second outer circuit pattern 140 may be a wiring that transmits an electrical signal and may be formed of a metal material having high electrical conductivity. To this end, the inner circuit pattern 120, the first outer circuit pattern 130, and the second outer circuit pattern 140 may be formed of at least one metal material selected from among gold (Au), silver (Ag), platinum (Pt), titanium (Ti), tin (Sn), copper (Cu), and zinc (Zn). In addition, the inner circuit pattern 120, the first outer circuit pattern 130, and the second outer circuit pattern 140 may be formed of paste or solder paste including at least one metal material selected from among gold (Au), silver (Ag), platinum (Pt), titanium (Ti), tin (Sn), copper (Cu), and zinc (Zn), which are excellent in bonding force. Preferably, the inner circuit pattern 120, the first outer circuit pattern 130, and the second outer circuit pattern 140 may be formed of copper (Cu) having high electrical conductivity and a relatively low cost.

At least one of the inner circuit pattern 120, the first outer circuit pattern 130, and the second outer circuit pattern 140 may be formed by a general process of manufacturing a circuit board, such as an additive process, a subtractive process, a modified semi additive process (MSAP), a semi additive process (SAP), etc., and detailed descriptions thereof will be omitted herein.

Preferably, the first outer circuit pattern 130 and the second outer circuit pattern 140 are an outermost circuit pattern disposed on an outermost side of the circuit board, and thus they may be formed by the SAP (Semi Additive Process) method.

Meanwhile, a via V may be disposed in the insulating layer 110. The via V is disposed in each insulating layer, and accordingly, the via V may serve to electrically connect circuit patterns disposed on different layers to each other.

A first via V1 may be disposed in the first insulating layer 111. The first via V1 may electrically connect the first circuit pattern 121 disposed on the upper surface of the first insulating layer 111 and the second circuit pattern 122 disposed on the lower surface of the first insulating layer 111.

A second via V2 may be disposed in the second insulating layer 112. The second via V2 may electrically connect the first circuit pattern 121 disposed on the upper surface of the first insulating layer 111 and the third circuit pattern 123 disposed on the upper surface of the second insulating layer 112.

A third via V3 may be disposed in the third insulating layer 113. The third via V3 may electrically connect the second circuit pattern 122 disposed on the lower surface of the first insulating layer 111 and the fourth circuit pattern 124 disposed on the lower surface of the third insulating layer 113.

A fourth via V4 may be disposed in the fourth insulating layer 114. The fourth via V4 may electrically connect the third circuit pattern 123 disposed on the upper surface of the second insulating layer 111 and the fifth circuit pattern 125 disposed on the upper surface of the fourth insulating layer 114.

A fifth via V5 may be disposed in the fifth insulating layer 115. The fifth via V5 may electrically connect the fourth circuit pattern 124 disposed on the lower surface of the third insulating layer 113 and the sixth circuit pattern 126 disposed on the lower surface of the fifth insulating layer 115.

A sixth via V6 may be disposed in the sixth insulating layer 116. The sixth via V6 may electrically connect the fifth circuit pattern 125 disposed on the upper surface of the fourth insulating layer 114 and the seventh circuit pattern 127 disposed on the upper surface of the sixth insulating layer 116.

A seventh via V7 may be disposed in the seventh insulating layer 117. The seventh via V7 may electrically connect the sixth circuit pattern 126 disposed on the lower surface of the fifth insulating layer 115 and the eighth circuit pattern 128 disposed on the lower surface of the seventh insulating layer 117.

An eighth via V1 may be disposed in the eighth insulating layer 118. The eighth via V8 may electrically connect the seventh circuit pattern 127 disposed on the upper surface of the sixth insulating layer 116 and the second outer circuit pattern 140 disposed on the upper surface of the primer layer 150.

A ninth via V9 may be disposed in the ninth insulating layer 119. The ninth via V9 may electrically connect the eighth circuit pattern 128 disposed on the lower surface of the seventh insulating layer 117 and the first outer circuit pattern 130 disposed on the lower surface of the ninth insulating layer 119.

The via V may be formed by filling an inside of a via hole formed in each insulating layer with a metal material.

The via hole may be formed by any one of mechanical, laser, and chemical processing. When the via hole is formed by machining, it can be formed using methods such as milling, drilling, and routing. When the via hole is formed by laser processing, it can be formed using methods such as UV or $CO_2$ laser. When the via hole is formed by chemical processing, it can be formed using a chemical containing amino silane, ketones, or the like. Accordingly, the insulating layer 110 may be opened.

Meanwhile, the laser processing is a cutting method that concentrates optical energy on a surface to melt and evaporate a part of the material to take a desired shape, and accordingly, complex formations by computer programs can be easily processed, and even composite materials that are difficult to cut by other methods can be processed.

In addition, the laser processing has a cutting diameter of at least 0.005 mm, and has the advantage of a wide range of processable thicknesses.

A laser processing drill preferably uses a YAG (Yttrium Aluminum Garnet) laser, a $CO_2$ laser, or an ultraviolet (UV) laser. YAG laser is a laser that can process both copper foil layers and insulating layers, and $CO_2$ laser is a laser that can process only insulating layers.

When the via hole is formed, the first to ninth vias V1, V2, V3, V4, V5, V6, V7, V8, and V9 may be formed by filling the inside of the through hole with a conductive material. The metal material forming the first to ninth vias V1, V2, V3, V4, V5, V6, V7, V8, and V9 may be any one material selected from copper (Cu), silver (Ag), tin (Sn), gold (Au), nickel (Ni), and palladium (Pd). In addition, the conductive material filling may use any one or a combination of electroless plating, electrolytic plating, screen printing, sputtering, evaporation, ink-jetting and dispensing.

Meanwhile, a protective layer may be disposed on an outermost side of the circuit board 100. Preferably, a first protective layer 160 may be disposed on the eighth insulating layer 118 (preferably, on the primer layer 150). In addition, a second protective layer 175 may be disposed under the ninth insulating layer 119.

The first protective layer 160 and the second protective layer 175 may be formed of at least one layer using any one or more of solder resist (SR), oxide, and Au. Preferably, the first protective layer 160 and the second protective layer 175 may be a solder resist.

Meanwhile, the first protective layer 160 is disposed on the primer layer 150. The first protective layer 160 may serve to support the second outer circuit pattern 140 disposed on the primer layer 150 and protect a surface of the second outer circuit pattern 140.

That is, the first protective layer 160 may partially overlap the second outer circuit pattern 140 disposed on the primer layer 150. An area of the first protective layer 160 may be smaller than an area of the eighth insulating layer 118. The area of the first protective layer 160 may be smaller than an area of the primer layer 150. The first protective layer 160 is partially or entirely disposed on the primer layer 150 and the second outer circuit pattern 140, and thus the first protective layer 170 may include an open region exposing a surface of the second outer circuit pattern 140.

The first protective layer 160 may include an open region having a recess shape. Preferably, the first protective layer 160 includes an open region exposing the second outer circuit pattern 140 disposed in the first region R1 and the second region R2. In this case, the first region R1 and the second region R2 may be an open region where the surface of the second outer circuit pattern 140 is exposed. That is, a device mounting pad on which a chip device is mounted, a core pad or BGA pad serving as a die for connection to an external board, and a signal transfer wire trace, etc. are disposed in the first region R1 and the second region R2. In addition, the first protective layer 160 has an open region exposing surfaces of the device mounting pad, the core pad, and the BGA pad in the first region R1 and the second region R2.

In conclusion, the first region R1 and the second region R2 may mean a region in which the surface of the second outer circuit pattern 140 is exposed through the first protective layer 160 among the primer layer 150 and an upper region of the second outer circuit pattern 140.

That is, the circuit board includes a first region R1, a second region R2, and a third region R3. The first region R1 and the second region R2 are an open region where the surface of the second outer circuit pattern 140 should be exposed through the first protective layer 160, and the third region R3 may be a buried region where the surface of the second outer circuit pattern 140 is covered by the first protective layer 160.

That is, the first region R1 is a region in which the first pad 142 and the trace 141a to be electrically connected to a component such as a chip among the second outer circuit pattern 140 are disposed. Accordingly, the first protective layer 160 may have an open region exposing the surface of the first pad 142 included in the first region R1. In addition, the second region R2 is a region in which the second pad 143 corresponding to a core pad or BGA pad serving as a die for bonding to an external board among the second outer circuit patterns 140 is disposed.

In addition, the second outer circuit pattern 140 disposed in the first region R1 as described above may have a reliability problem such as collapsing or sweeping due to various factors. Furthermore, the trace 141a of the second outer circuit pattern 140 is a fine circuit pattern. Accordingly, the trace 141a is disposed on the primer layer 150 with a line width W1 of 10 μm or less and a distance of 10 μm or less. Accordingly, the trace 141a disposed on the first region R1 may easily collapse or sweep even with various small external impacts.

Accordingly, in the embodiment, the first protective layer 160 is disposed on the primer layer 150 corresponding to the first region R1 to improve the reliability of the second outer circuit pattern 140 disposed on the first region R1.

That is, The first protective layer 160 may be disposed in a region in which the second outer circuit pattern 140 is not disposed among the upper surfaces of the primer layer 150. For example, the first protective layer 160 may be disposed on the upper surface of the primer layer 150, and accordingly, may be disposed between a plurality of second outer circuit patterns 140 on the first region R1.

In this case, the second outer circuit pattern 140 includes a second-first outer circuit pattern formed on the first region R1 and the second region R2 and a second-second outer circuit pattern formed on the third region R3.

In addition, an upper surface of the primer layer 150 may include a first upper surface corresponding to the first region R1, a second upper surface corresponding to the second region R2, and a third upper surface corresponding to the third region R3.

In this case, the first protective layer 160 is entirely disposed on the primer layer 150 without distinguishing the first region R1, the second region R2 and the third region R3. That is, the first protective layer 160 may be respectively disposed in a region between the second-first outer circuit patterns and a region between the second-second outer circuit patterns.

Accordingly, the first protective layer 160 includes a first part disposed on the first region R1, a second part disposed on the second region R2 and a third part disposed on the third region R3.

In this case, the first protective layer 160 may have a step. That is, a surface of the second outer circuit pattern 140 should be exposed to an outside in the first region R1 and the second region R2, and a surface of the second outer circuit pattern 140 should be covered with a protective layer in the third region R3.

Here, the second outer circuit pattern 140 disposed on the first region R1 and the second region R2 may have different widths according to functions. For example, the second outer circuit pattern 140 disposed on the first region R1 and the second region R2 may include the first pad 142, the second pad 143, and the trace 141 as described above.

In this case, the trace 141a may have a width of 10 μm or less. In addition, the first pad may have a width of about 45 μm. In addition, the second pad 143 may have a width W3 of 100 μm to 300 μm.

Accordingly, the embodiment forms the first protective layer 160 with different heights or structures in which the trace 141a is disposed, a region in which the first pad 142 is disposed, and a region in which the second pad 143 is disposed, based on the open region of the first protective layer 160 corresponding to the solder resist.

The first protective layer 160 may include a first part disposed on the first region R1, a second part disposed on the second region R2, and a third part disposed on the third region R3. In addition, a height of at least one of the first part, the second part, and the third part may be different from a height of at least one of the other of the first part, the second part, and the third part.

For example, an upper surface of the first part disposed on the first region R1 may be positioned lower than an upper surface of the second part disposed on the second region R2 and an upper surface of the third part disposed on the third region R3.

In addition, an upper surface of the second part may be positioned higher than an upper surface of the first part. In addition, an upper surface of the second part may have the same height as an upper surface of the third part. That is, the upper surface of the second part and the upper surface of the third part may be positioned on the same plane.

Hereinafter, the first protective layer 160 will be described in detail.

The first protective layer 160 may be disposed on the primer layer 150. The first protective layer 160 is a solder resist.

The first protective layer 160 may be disposed between the second outer circuit patterns 140 on the primer layer 150. That is, a plurality of second outer circuit patterns 140 are disposed on the primer layer 150 while being spaced apart from each other by a predetermined distance. Also, the first protective layer 160 may be disposed on a region of an upper surface of the primer layer 150 where the second outer circuit pattern 140 is not disposed. In addition, the first protective layer 160 may be selectively disposed on the second outer circuit pattern 140.

Hereinafter, the first protective layer 160 will be described as a solder resist 160.

A solder resist 160 may be disposed on a region of the upper surface of the primer layer 150 on which the second outer circuit pattern 140 is not disposed.

Accordingly, a lower surface of the solder resist 160 may directly contact the upper surface of the primer layer 150. In addition, the solder resist 160 may have a structure in direct contact with the second outer circuit pattern 140.

For example, a first part of the solder resist 160 disposed on the first region R1 may be in direct contact with a side surface of the second outer circuit pattern 140. In addition, the first part of the solder resist 160 disposed on the first region R1 may be in non-contact with an upper surface of the second outer circuit pattern 140. That is, the first part of the solder resist 160 disposed on the first region R1 may expose the upper surface of the second outer circuit pattern 140.

In this case, the trace 141a and the first pad 142 of the second outer circuit pattern 140 of the embodiment disposed on the first region R1 may have different heights. This will be described in more detail below.

Accordingly, a height of the upper surface of the first part of the solder resist 160 may be lower than a height of the upper surface of the trace 141a of the second outer circuit pattern 140. In addition, a height of the upper surface of the first part of the solder resist 160 may be higher than a height of the upper surface of the first pad 142 of the second outer circuit pattern 140.

In other words, the upper surface of the first part of the solder resist 160 of the embodiment may be positioned between the upper surface of the trace 141a and the upper surface of the first pad 142 of the second outer circuit pattern 140.

Accordingly, the first part of the solder resist 160 disposed on the first region R1 may be disposed while entirely exposing the upper surface of the trace 141a and partially exposing the side surface of the trace 141a. In other words, the first part of the solder resist 160 disposed on the first region R1 may be disposed while partially covering the side surface of the trace 141a.

In addition, the first part of the solder resist 160 disposed on the first region R1 may be disposed to entirely cover the upper and side surfaces of the first pad 142.

In addition, a second part of the solder resist 160 disposed on the second region R2 may be in direct contact with a side surface of the second outer circuit pattern 140. In addition, the second part of the solder resist 160 disposed on the second region R2 may be in direct contact with a part of the upper surface of the second outer circuit pattern 140. In addition, the second part of the solder resist 160 disposed on the second region R2 may expose the upper surface of the second outer circuit pattern 140.

In addition, a third part of the solder resist 160 disposed on the third region R3 may be in direct contact with the side surface of the second outer circuit pattern 140. In addition, the third part of the solder resist 160 disposed on the third region R3 may be in direct contact with the upper surface of the second outer circuit pattern 140. The third part of the solder resist 160 may be disposed covering the second outer circuit pattern 140 while protruding with a certain height on the upper surface of the second outer circuit pattern 140. In detail, the third part of the solder resist 160 disposed on the third region R3 may be disposed surrounding the side surface and the upper surface of the second outer circuit pattern 140.

Meanwhile, the second outer circuit pattern 140 according to the embodiment may have different heights for each region. Meanwhile, the second outer circuit pattern 140 may include the trace 141, the first pad 142 and the second pad 142 as described above.

In this case, the first pad 142 may be disposed on the first region R1. In addition, the second pad 142 may be disposed on the second region R2. In addition, the trace 141 may include a first trace 141a disposed on the first region R1 and a second trace 141b disposed on the third region R3.

In addition, a height of the first trace 141a may be the same as a height of the second trace 141b.

The first trace 141a and the second trace 141b may have a first height H1. Here, the height may correspond to the thickness.

The first height H1 of the first trace 141a and the second trace 141b may have a range of 14.5 μm to 16.25 μm. In this case, the upper surfaces of the first trace 141a and the second trace 141b may be positioned higher than the upper surface of the solder resist 160. This is because, when the upper surface of the solder resist 160 is positioned higher than the first trace 141a and the second trace 141b, a reliability problem may occur in which the solder resist 160 remains on the upper surfaces of the first trace 141a and the second trace 141b, and thus a problem may occur in a function of a circuit wiring.

The first part of the solder resist 160 is removed through a thinning process while being disposed on the first region R1 while covering the first trace 141a, and accordingly, it has a height lower than a height of the first trace 141a. In this case, the height of the first part of the solder resist 160 is 70% to 85% of the heights of the first trace 141a and the second trace 141b. Accordingly, the embodiment solves the problem that resin remains on the upper surface of the first trace 141a during the thinning process of the solder resist 160.

That is, the first part of the solder resist 160 may have a second height H2. The second height H2 may be smaller than the first height H1. For example, the second height H2 of the first part of the solder resist 160 may satisfy 70% to 85% of the first height H1 of the first trace 141a. For example, when the second height H2 of the first part of the solder resist 160 is smaller than 70% of the first height H1 of the first trace 141a, the first trace 141a may not be stably supported by the first part of the solder resist 160. For example, when the second height H2 of the first part of the solder resist 160 is smaller than 70% of the first height H1 of the first trace 141a, an area of the first trace 141a and the first pad 142 protruding on the surface of the solder resist 160 increases, and accordingly, it may not be easy to control a process of dissolving the first pad 142. In addition, when the second height H2 of the first part of the solder resist 160 is greater than 85% of the first height H1 of the first trace 141a, a resin remaining on the surfaces of the first trace 141a and the first pad 142 may not be completely removed, and thus a reliability problem may occur.

Meanwhile, the third part of the solder resist 160 may have a third height H3. A third height H3 of the third part of the solder resist 160 is greater than the first height H1 and the second height H2.

In this case, the third part of the solder resist 160 is disposed to cover the second outer circuit pattern 140 in order to stably protect the second outer circuit pattern 140. In this case, the third height H3 may be 20 μm to 40 μm. When the third height H3 is smaller than 20 μm, the second outer circuit pattern 140 buried in the third part of the solder resist 160 cannot be stably protected from various factors. In addition, when the third height H3 is greater than 40 μm, a total thickness of the circuit board may increase. In addition, when the third height H3 is greater than 40 μm, the cost of manufacturing a circuit board may increase.

Meanwhile, the second part of the solder resist 160 disposed on the second region R2 may include an opening region. The second part of the solder resist 160 may have an opening region disposed on the second region R2 and exposing a portion of the upper surface of the second pad 143. In addition, the second part of the solder resist 160 may dispose to cover a portion of the upper surface of the second pad 143. In this case, the height of the second part of the solder resist 160 may correspond to the height of the third part of the solder resist 160.

That is, the second outer circuit pattern 140 included on the second region R2 is the second pad 143. As described above, the second pad 143 may be a BGA pad or a core pad. Accordingly, the second pad 143 may have a relatively large width compared to other pads. For example, the second pad 143 may have a width W3 of 100 μm to 300 μm. In addition, the second pad 143 has a relatively large width, and accordingly, it is not greatly affected by an exposure resolution. That is, the second pad 143 has a relatively large width, and accordingly, even if the upper surface of the second pad 143 is partially exposed rather than entirely exposed, there is no problem in reliability. In other words, even if the upper surface of the second pad 143 is partially exposed, it does not affect the die function for bonding with other external boards. Accordingly, the second part of the solder resist 160 may be disposed while covering a portion of the upper surface of the second pad 143 as described above. Specifically, the second part of the solder resist 160 has a third height H3 equal to the height of the first part, protrudes on the upper surface of the second pad 143, and has an opening region that exposes a portion of the upper surface of the second pad 143.

Meanwhile, the second pad 143 may also be subjected to a dissolving process together with the first pad 142. Accordingly, the upper surface of the second pad 143 may have a step. That is, the second pad 143 may include a first portion covered by the second part of the solder resist 160 and a second portion exposed through the open region of the second part of the solder resist 160. In addition, a height of the first portion of the second pad 143 may be different from a height of the second portion of the second pad 143.

In addition, the first portion of the second pad 143 may have a first height H1. In addition, the second portion of the second pad 143 may have a fourth height H4 lower than the first height H1. The fourth height H4 of the second portion of the second pad 143 may have a range of 14.5 μm to 16.25 μm, but is not limited thereto.

However, the fourth height H4 of the second portion of the second pad 143 may be lower than the height of the first part of the solder resist 160. For example, the fourth height H4 of the second portion of the second pad 143 may have a range of 70% to 99% of the height of the first part of the solder resist 160. This is because a dissolution process proceeds only for the second portion exposed through the open region of the second part of the solder resist 160 among an entire region of the upper surface of the second pad 143. Accordingly, a height of the dissolved second portion may be lower than a height of the first portion, and further may be lower than a height of the first part of the solder resist 160.

In this case, the process of dissolving the second pad 143 may be performed together with the first pad 142.

Meanwhile, the height of the first pad 142 may be the same as the height of the second portion of the second pad 143. That is, the height of the first pad 142 may be lower than the height of the first portion of the second pad 143. Furthermore, the height of the first portion of the second pad 143 may be the same as the height of the first trace 141a.

That is, a copper dissolution proceeds on the first pad 142 together with the second portion of the second pad 143, and accordingly, the first pad 142 may have a fourth height H4 corresponding to the second portion of the second pad 143.

Specific features of the first pad 142 and the second pad 143 having the fourth height H4 will be described below.

The solder resist 160 may use a photo solder resist film. The solder resist 160 may have a structure in which a resin and a filler are mixed.

For example, the solder resist 160 may include a filler such as $BaSO_4$, $SiO_2$, or Talc, and a content of the filler may be 20 wt % to 35 wt %.

In this case, when the content of the filler included in the solder resist 160 is less than 20 wt %, the second outer circuit pattern 140 may not be stably protected by the solder resist 160. In addition, when the content of the filler included in the solder resist 160 is greater than 35 wt %, a portion of the filler may remain on the second outer circuit pattern 140 when the solder resist 160 is developed.

Meanwhile, an adhesive part 170 may be disposed on the first pad 142 and the second portion of the second pad 143 having the fourth height H4. The adhesive part 170 may include a solder. For example, the adhesive part 170 may be a solder alloy.

The adhesive part 170 may be disposed on the first pad 142 and the second portion of the second pad 143. The first pad 142 and the second pad 143 in the region where the adhesive part 170 is disposed may have a fourth height H4.

That is, the solder resist 160 may be a protective layer that protects the surface of the second outer circuit pattern 140 in the third region R3 or may be a support layer supporting the second outer circuit pattern 140 in the first region R1.

In this case, the comparative example includes a circuit pattern disposed on the insulating layer with a protruding structure. In addition, the circuit pattern may be independently disposed on the insulating layer without being supported by another support layer. Accordingly, the comparative example has problems such as collapse or sweep of the circuit pattern in the region where the fine pattern is arranged.

This may occur in the circuit pattern of the outermost layer of the circuit board including the circuit pattern manufactured by the SAP method.

Alternatively, the embodiment includes a primer layer 150 disposed on the eighth insulating layer 118 and a second outer circuit pattern 140 disposed on the primer layer 150.

In addition, first to third parts of the solder resist 160 serving as a support layer and a protective layer are disposed on the primer layer 150 while surrounding the second outer circuit pattern 140.

In this case, the solder resist 160 may be disposed on the first region R1, the second region R2, and the third region R3. The solder resist 160 may support the second outer circuit pattern 140 disposed on an outermost layer of the circuit board 100, and in particular, may support the trace 141a and the first pad 142 of the second outer circuit pattern 140 disposed on the first region R1, so that the second outer circuit pattern 140 may be protected from external impact.

Meanwhile, the solder resist 160 is removed through a thinning process while having a structure protruding from the upper surface of the second outer circuit pattern 140 on the first region R1 and the second region R2, and includes a first part and a second part. In this case, when the height of the first part of the solder resist 160 is equal to or higher than the height of the second outer circuit pattern 140, this may cause a reliability problem in that the second outer circuit pattern 140 is not completely exposed or resin remains on the surface of the second outer circuit pattern 140 in a process of removing the solder resist 160.

Accordingly, the embodiment allows the height of the first part of the solder resist 160 to be lower than the height of the second outer circuit pattern 140 in the process of removing the solder resist 160.

In this case, the first pad 142 is a region where the adhesive part 170 is disposed. However, when the height of the first part of the solder resist 160 is lower than the height of the first pad 142, there may be a problem that the adhesive part 170 is not accurately positioned on the upper surface of the first pad 142 in a process of arranging the adhesive part 170.

Therefore, the embodiment allows the upper surface of the first pad 142 to be positioned lower than the first part of the solder resist 160 by copper dissolution on the upper surface of the first pad 142 on which the adhesive part 170 is disposed. In this case, the copper dissolution may be performed by the adhesive part 170. However, the embodiment is not limited thereto. For example, the embodiment may allow the first pad 142 to be dissolved using a separate lead-free solder alloy for dissolving the first pad 142, and accordingly, a process of dissolving the upper surface of the first pad 142 is performed so that the upper surface of the first pad 142 is positioned lower than the upper surface of the first part of the solder resist 160. Furthermore, when the dissolution process is completed, the embodiment may proceed with a process of removing the lead-free solder alloy.

That is, the second outer circuit pattern 140 according to the embodiment may be disposed on each of the first region R1 to the third region R3.

In addition, the second outer circuit pattern 140 disposed on the first region R1 includes a first trace 141a and a first pad 142.

In addition, the second outer circuit pattern 140 disposed on the second region R2 includes a second pad 143.

In addition, the second outer circuit pattern 140 disposed on the third region R3 includes a second trace 141b and a third pad (not shown). The third pad may be a via pad, and may include various other pads.

In this case, the second trace 141b and the third pad in the third region R3 may have a first height H1.

In addition, the first trace 141a in the first region R1 may have a first height H1 equal to the height of the second trace 141b and the third pad in the third region R3.

In this case, the solder resist 160 may include a first part disposed on the first region R1, and the first part may have a second height H2 lower than the first height H1. The second height H2 may have a range between 70% and 85% of the first height H1.

In addition, the first pad 142 in the first region R1 may have a height lower than the height of the first trace 141a. That is, a fourth height H4 of the first pad 142 may be lower than the first height H1 of the first trace 141a. In addition, the fourth height H4 of the first pad 142 may be lower than a second height H2 of the first part of the solder resist 160. That is, the second height H2 of the first part of the solder resist 160 may be lower than the first height H1 of the first trace 141a, and may be higher than the fourth height H4 of the first pad 142. For example, the fourth height H4 may have a range between 70% and 99% of the second height H2.

Meanwhile, the second pad 143 in the second region R2 may include a first portion that has the same height as the height of the first trace 141a and is covered by the second part of the solder resist 160. In addition, the second pad 143 in the second region R2 may include a second portion that is exposed by an open region of the second part of the solder resist 160 and has a fourth height H4 lower than the first height H1. The fourth height H4 of the second pad 143 may be equal to a height of the first pad 142.

In other words, the embodiment proceeds to dissolve the first pad 142 and the second portion of the second pad 143 under a same condition, so that the upper surface of the first pad 142 and the upper surface of the second portion of the second pad 143 may be lower than the upper surface of the first part of the solder resist 160. However, the embodiment is not limited thereto. That is, the height of the first pad 142 may be different from the height of the second portion of the second pad 143. For example, the adhesive part 170 disposed on the second pad 143 may be stably disposed in the open region of the second part of the solder resist 160. Accordingly, a height of the second part of the second pad 143 may be higher than a height of the first pad 142. For example, the upper surface of the second portion of the second pad 143 may be positioned higher than the upper surface of the first part of the solder resist 160. However, the upper surface of the second portion of the second pad 143 is a part in contact with the adhesive part 170, and accordingly, it may be positioned lower than the upper surface of the first portion of the second pad 143.

FIG. 7 is a view illustrating a second outer circuit pattern before dissolution according to an embodiment, and FIG. 8 is a view illustrating a second outer circuit pattern after dissolution according to an embodiment.

Referring to FIGS. 7 and 8, the embodiment includes a first pad 142 and a first trace 141*a* disposed in the open region of the solder resist 160, and copper dissolution may be performed on the first pad 142 using a lead-free solder alloy.

In this case, before dissolution, the first part of the solder resist 160 has a height lower than the height of the first pad 142 and the first trace 141*a*.

In addition, the embodiment allows the height of the first pad 142 to be lower than the height of the first part of the solder resist 160 through copper dissolution for the first pad 142.

Accordingly, the height of the first pad 142 according to an embodiment may be different from the height of the first trace 141*a*. For example, the solder resist 160 includes a first part. In addition, the height of the first part may be lower than the height of the first trace 141*a* and higher than the height of the first pad 142. In this case, the upper surface of the first pad 142 may have a curved surface dissolved by a lead-free soldering alloy. Therefore, the embodiment can solve the reliability problem of resin remaining on the upper surface of the first pad while the height of the first pad before dissolution is higher than the height of the first part of the solder resist 160. In addition, the embodiment may enable stable support of the adhesive part 170 as the height of the first pad after dissolution is lower than the height of the first part of the above solder resist 160.

FIGS. 9 to 16 are views illustrating a method of manufacturing a circuit board shown in FIG. 3 in order of process.

Referring to FIG. 9, the embodiment may preferentially proceed with a process of manufacturing an inner substrate 100-1 for manufacturing an inner portion of the circuit board 100.

The process for manufacturing the inner substrate 100-1 will be briefly described.

The inner substrate 100-1 may include one insulating layer, or alternatively, a plurality of insulating layers.

In FIG. 9, the inner substrate 100-1 is illustrated as having a 7-layer insulating layer structure, but is not limited thereto. For example, the inner-layer substrate 100-1 may include insulating layers with a number of layers less than 7, and may alternatively include insulating layers with a number of layers greater than 7.

The inner substrate 100-1 may include insulating layers other than the insulating layer disposed on an outermost layer of the circuit board 100. For example, the inner substrate 100-1 may include insulating layers other than an uppermost insulating layer and a lowermost insulating layer of the circuit board 100.

Briefly describing the process of manufacturing the inner substrate 100-1, the first insulating layer 111 is preferentially prepared.

Then, when the first insulating layer 111 is prepared, a first via V1 is formed in the first insulating layer 111, and a circuit pattern 121 and a second circuit pattern 122 are formed on upper and lower surfaces of the first insulating layer 111, respectively.

Thereafter, a second insulating layer 112 is formed on the first insulating layer 111, and a third insulating layer 113 is formed under the first insulating layer 111.

Next, a second via V2 is formed in the second insulating layer 112, and a third circuit pattern 123 is formed on an upper surface of the second insulating layer 112. In addition, a third via V3 is formed in the third insulating layer 113, and a fourth circuit pattern 124 is formed under a lower surface of the third insulating layer 113.

Thereafter, a fourth insulating layer 114 is formed on the second insulating layer 112, and a fifth insulating layer 115 is formed under the third insulating layer 113.

Next, a fourth via V4 is formed in the fourth insulating layer 114, and a fifth circuit pattern 125 is formed on an upper surface of the fourth insulating layer 114. In addition, a fifth via V5 is formed in the fifth insulating layer 115, and a sixth circuit pattern 126 is formed under a lower surface of the fifth insulating layer 115.

Thereafter, a sixth insulating layer 116 is formed on the fourth insulating layer 114, and a seventh insulating layer 117 is formed under the fifth insulating layer 115.

Next, a sixth via V6 is formed in the sixth insulating layer 116, and a seventh circuit pattern 127 is formed on an upper surface of the sixth insulating layer 116. In addition, a seventh via V7 is formed in the seventh insulating layer 117, and an eighth circuit pattern 128 is formed under a lower surface of the seventh insulating layer 117.

The process of manufacturing the inner substrate 100-1 is a known technique in the art to which the present invention belongs, and a detailed description thereof will be omitted.

Referring to FIG. 10, when the inner substrate 100-1 is manufactured, an eighth insulating layer 118 corresponding to a first outermost insulating layer is formed on an upper surface of the inner substrate 100-1. In addition, a ninth insulating layer 119 corresponding to a second outermost insulating layer is formed under a lower surface of the inner substrate 100-1.

In this case, when the eighth insulating layer 118 and the ninth insulating layer 119 are laminated, a primer layer 150 may be respectively disposed on the upper surface of the eighth insulating layer 118 and the lower surface of the ninth insulating layer 119, and a metal layer 155 may be disposed on the primer layer 150. The metal layer 155 may serve to planarize the eighth insulating layer 118 and the ninth insulating layer 119 to have a uniform height. For example, the metal layer 155 may be disposed to improve the laminating reliability of the eighth insulating layer 118 and the ninth insulating layer 119.

The primer layer 150 may serve to increase bonding strength between each of the eighth insulating layer 118 and the ninth insulating layer 119 and the first and second outer circuit pattern 130 and 140 disposed on the upper and lower parts thereof, respectively. That is, when the first outer circuit pattern 130 and the second outer circuit pattern 140 are disposed without the primer layer 150, the bonding strength between the eighth insulating layer 118 and the second outer circuit pattern 140 is low, and thus may be separated from each other.

Meanwhile, FIG. 11 illustrates that the primer layer 150 is disposed on the upper surface of the eighth insulating layer 118 and the lower surface of the ninth insulating layer 119, respectively, but is not limited thereto. For example, the primer layer 150 may be selectively disposed on a surface of an insulating layer on which a fine circuit pattern is to be disposed. That is, when only the first outer circuit pattern 130 is a fine circuit pattern, the primer layer 150 may be disposed only on the lower surface of the ninth insulating layer 119. In addition, when only the second outer circuit pattern 140 is a fine circuit pattern, the primer layer 150 may be disposed only on the upper surface of the eighth insulating layer 118. In addition, when both the first outer circuit pattern 130 and the second outer circuit pattern 140 are fine circuit patterns, the primer layer 150 may be disposed on both the upper surface of the eighth insulating layer 118 and the lower surface of the ninth insulating layer 119.

Referring to FIG. 11, when the eighth insulating layer 118 and the ninth insulating layer 119 are disposed, a via hole VH is respectively formed in the eighth insulating layer 118 and the ninth insulating layer 119. In this case, the via hole VH may be respectively formed not only in the eighth insulating layer 118 and the ninth insulating layer 119 but also in the primer layer 150 and the metal layer 155.

Next, referring to FIG. 12, when the via hole VH is formed, an etching process of removing the metal layer 155 disposed on the primer layer 150 may be performed. For example, a flash etching process may be performed to remove the metal layer 155 after the via hole VH is formed, and thus a process for exposing a surface of the primer layer 150 may be performed.

Next, referring to FIG. 13, a via V forming process for filling the via hole VH may be performed, and thus the second outer circuit pattern 140 may be formed on the upper surface of the eighth insulating layer 118, and the first outer circuit pattern 130 may be formed on the lower surface of the ninth insulating layer 119. In this case, the first outer circuit pattern 130 of the embodiment is shown as a general circuit pattern rather than a micro circuit pattern. However, the embodiment is not limited thereto, and the first outer circuit pattern 130 may also be a fine circuit pattern together with the second outer circuit pattern. Accordingly, when the first outer circuit pattern 130 is a general circuit pattern, the primer layer 150 between the ninth insulating layer 119 and the first outer circuit pattern 130 may be omitted.

A second outer circuit pattern 140 is disposed on the upper surface of the eighth insulating layer 118. In this case, the second outer circuit pattern 140 disposed on the upper surface of the eighth insulating layer 118 includes a portion disposed in the open region R1 and R2 of the first protective layer 170 and a portion disposed in an arrangement region R3 of the first protective layer 170. In addition, a traces and a pad, which are wiring lines for signal transmission, may be disposed on each of the regions R1, R2 and R3.

In detail, the trace 141 and the first pad 142 may be disposed on the first region R1. The first pad 142 may be a mounting pad on which a device is mounted.

In addition, a second pad 143 may be disposed on a second region R2. The second pad 143 may be a BGA pad or a core pad. In particular, a width of the second pad 143 may be greater than a width of the first pad 142.

Therefore, the second pad 143 is not greatly affected by a development resolution, and accordingly, a shape of a solder resist 170 disposed in the second region may be different from a shape of the solder resist 170 disposed in the first region R1.

Meanwhile, the trace 141 may include a first trace 141a disposed on the first region R1 and a second trace 141b disposed on the second region R2.

Next, referring to FIG. 14, a solder resist layer is disposed on the primer layer 150 to cover the second outer circuit pattern 140. In this case, the solder resist layer may be disposed in all of the first region R1, the second region R2, and the third region R3, and may be formed to have a height greater than the upper outer circuit pattern 140.

Referring to FIG. 15, when the solder resist layer is formed, the solder resist layer may be exposed and developed to form a solder resist 160 having different heights for each region. Preferably, the embodiment partially exposes the second region R2 of the solder resist layer and entirely exposes the third region R3, and accordingly, it is possible to proceed with the process of entirely developing the first region R1 of the solder resist layer and partially developing the second region R2.

To this end, UV exposure is performed by masking only a desired region on the solder resist layer, and then the solder resist 160 may be formed by performing a process of adjusting the height of the solder resist layer in an unexposed region by dipping in an organic alkaline compound containing tetramethylammonium hydroxide (TMAH) or trimethyl-2-hydroxyethylammonium hydroxide (choline), etc. In this case, a height of the solder resist layer in the first region R1 may be adjusted based on a height of the second outer circuit pattern 140. For example, a height of the solder resist layer in the first region R1 may be 70% to 85% of a height of the second outer circuit pattern 140.

Next, referring to FIG. 16, the process of dissolving the first pad 142 disposed on the first region R1 and the second pad 143 disposed on the second region R2 may be performed. The dissolution may be performed through an adhesive part 170 disposed on the first pad 142 and the second pad 143. However, the embodiment is not limited thereto, and the dissolution may be performed using a solder alloy of the same material as the adhesive part 170, and the solder alloy may be removed when the dissolution is complete.

Specifically, the first pad 142 may include copper. In addition, the copper may be dissolved according to a temperature or component content of the solder alloy used for soldering, and so that a height may be lowered. For example, the dissolution of the copper may be affected by the concentration, temperature, and flow rate of the copper constituting the solder alloy. For example, For example, if the copper concentration in a solder alloy increases to 1.5% by mass, the copper is dissolved at a rate equivalent to that of a general Sn—Pb eutectic alloy at a temperature of 5650K. Accordingly, the second outer circuit pattern 140 according to an embodiment may have different heights for each region.

An embodiment may include a first pad and a first trace disposed in an open region of a solder resist, and may allow copper dissolution of the first pad to proceed using a lead-free solder alloy. In this case, a height of the first part of the solder resist is lower than heights the first pad and the first trace before dissolution. In addition, the embodiment allows a height of the first pad to be lower than the height of the first part of the solder resist through the copper dissolution of the first pad. Accordingly, the height of the first pad of the embodiment may be different from a height of the first trace. For example, the solder resist includes a first part. In addition, a height of the first part may be lower than a height of the first trace and higher than a height of the first pad. In this case, an upper surface of the first pad may have a curved surface dissolved by the lead-free solder alloy. Accordingly, the embodiment allows the height of the first pad before the dissolution to be higher than the height of the first part of the solder resist, so that a reliability problem in which resin remains on the upper surface of the first pad may be solved. In addition, the embodiment allows the height of the first pad after the dissolution to be lower than the height of the first part of the solder resist, so that an adhesive part can be stably supported.

The characteristics, structures, effects, and the like described in the above-described embodiments are included in at least one embodiment, but are not limited to only one embodiment. Furthermore, the characteristic, structure, and effect illustrated in each embodiment may be combined or modified for other embodiments by a person skilled in the art. Therefore, it should be construed that contents related to such combination and modification are included in the scope of the embodiment.

Embodiments are mostly described above, but the embodiments are merely examples and do not limit the embodiments, and a person skilled in the art may appreciate that several variations and applications not presented above may be made without departing from the essential characteristic of embodiments. For example, each component specifically represented in the embodiments may be varied. In addition, it should be construed that differences related to such a variation and such an application are included in the scope of the embodiment defined in the following claims.

The invention claimed is:

1. A circuit board comprising:
a build-up insulating layer including a plurality of insulating layers stacked along a vertical direction;
an outer circuit pattern disposed on the build-up insulating layer; and
a protective layer disposed on the build-up insulating layer,
wherein the protective layer includes a first part and a second part having a thickness greater than that of the first part,
wherein the outer circuit pattern includes a first pad and a first trace penetrating the first part of the protective layer,
wherein the first pad and the first trace have different thicknesses,
wherein the thickness of the first pad is smaller than the thickness of the first part of the protective layer, and
wherein the first pad does not overlap the protective layer in the vertical direction.

2. The circuit board of claim 1, wherein an upper surface of the first pad is positioned lower than an upper surface of the first trace.

3. The circuit board of claim 1, wherein the first pad is provided in plurality on the build-up insulating layer, and
wherein the first trace is disposed in a region between the plurality of first pads.

4. The circuit board of claim 3, wherein a width of the first pad in a horizontal direction is greater than a width of the first trace in the horizontal direction.

5. The circuit board of claim 1, wherein the first part of the protective layer is provided with a same height around each of a side surface of the first pad and a side surface of the first trace.

6. The circuit board of claim 5, wherein an upper surface of the first pad is positioned lower than the first part of the protective layer, and
wherein an upper surface of the first trace is positioned higher than the first part of the protective layer.

7. The circuit board of claim 6, wherein the second part of the protective layer is positioned higher than the upper surfaces of the first pad and the first trace.

8. The circuit board of claim 1, wherein an upper surface of the first pad includes a curved surface.

9. The circuit board of claim 1, wherein a height of the first part of the protective layer satisfies a range of 70% to 85% of a height of the first trace, and
wherein a height of the first pad satisfies a range of 70% to 99% of the height of the first part.

10. The circuit board of claim 1, wherein the outer circuit pattern further includes a second trace overlapping the second part of the protective layer in the vertical direction, and
wherein a height of the second trace corresponds to a height of the first trace.

11. The circuit board of claim 10, wherein the outer circuit pattern further includes a second pad partially overlapping the second part of the protective layer in the vertical direction; and
wherein the protective layer includes an opening overlapping an upper surface of the second pad in the vertical direction.

12. The circuit board of claim 11, wherein the upper surface of the second pad includes a first portion that does not overlap with the opening in the vertical direction and a second portion that does not overlap with the opening in the vertical direction, and
wherein the first portion has a step with the second portion.

13. The circuit board of claim 12, wherein the first portion of the second pad is positioned higher than the second portion of the second pad.

14. The circuit board of claim 13, wherein a height of the first portion of the second pad corresponds to a height of the first trace.

15. The circuit board of claim 13, wherein a height of the second portion of the second pad corresponds to a height of the first pad.

16. A semiconductor package comprising:
a build-up insulating layer including a plurality of insulating layers stacked along a vertical direction;
an outer circuit pattern disposed on the build-up insulating layer;
a protective layer disposed on the build-up insulating layer; and
an adhesive part disposed on the outer circuit pattern,
wherein the protective layer includes a first part and a second part having a thickness greater than that of the first part,
wherein the outer circuit pattern includes a first pad and a first trace penetrating the first part of the protective layer,
wherein the first pad and the first trace have different thicknesses,
wherein the thickness of the first pad is smaller than the thickness of the first part of the protective layer, and
wherein the first pad does not overlap the protective layer in the vertical direction.

17. The semiconductor package of claim 16, wherein an upper surface of the first pad is positioned lower than an upper surface of the first trace, and wherein the upper surface of the first trace is higher than a lower surface of the adhesive part.

18. The semiconductor package of claim 16, wherein the first part of the protective layer is provided with the same height around each of a side surface of the first pad and a side surface of the first trace, wherein an upper surface of the first pad is positioned lower than the first part of the protective layer, wherein an upper surface of the first trace is positioned higher than the first part of the protective layer, and wherein the second part of the protective layer is positioned higher than the upper surfaces of each of the first pad and the first trace.

19. The semiconductor package of claim 16, wherein an upper surface of the first pad includes a curved surface contacting a lower surface of the adhesive part.

20. The semiconductor package of claim 16, wherein the outer circuit pattern further includes a second pad partially overlapping the second part of the protective layer in the vertical direction, wherein the protective layer includes an opening overlapping an upper surface of the second pad in the vertical direction, wherein an upper surface of the second pad includes a first portion that does not overlap with the opening in the vertical direction and a second portion that does not overlap with the opening in the vertical direction and has a step with the first portion, and wherein the adhesive part includes a second adhesive member disposed on the second portion of the second pad.

\* \* \* \* \*